(12) United States Patent  
Mitsuyoshi

(10) Patent No.: US 8,504,194 B2
(45) Date of Patent: Aug. 6, 2013

(54) SUBSTRATE PROCESSING APPARATUS AND SUBSTRATE TRANSPORT METHOD

(75) Inventor: Ichiro Mitsuyoshi, Kyoto (JP)

(73) Assignee: Dainippon Screen MFG. Co., Ltd. (JP)

( * ) Notice: Subject to any disclaimer, the term of this patent is extended or adjusted under 35 U.S.C. 154(b) by 744 days.

(21) Appl. No.: 12/722,063

(22) Filed: Mar. 11, 2010

(65) Prior Publication Data

US 2010/0249993 A1    Sep. 30, 2010

(30) Foreign Application Priority Data

Mar. 30, 2009   (JP) ................................. 2009-082844

(51) Int. Cl.
*B65H 1/00*       (2006.01)
*G06F 7/00*       (2006.01)

(52) U.S. Cl.
USPC ........... 700/228; 700/230; 700/231; 700/213; 414/222.07; 414/806; 414/222.03

(58) Field of Classification Search
None
See application file for complete search history.

(56) References Cited

U.S. PATENT DOCUMENTS

| 2002/0044860 | A1  | 4/2002  | Hayashi et al. |
| 2005/0005849 | A1  | 1/2005  | Masuoka |
| 2006/0185976 | A1* | 8/2006  | Sendai et al. ............. 204/275.1 |
| 2006/0241813 | A1  | 10/2006 | Babu et al. |
| 2006/0245853 | A1  | 11/2006 | Okuno |
| 2008/0159832 | A1  | 7/2008  | Mitsuyoshi |
| 2008/0170931 | A1  | 7/2008  | Hashimoto |
| 2008/0199284 | A1  | 8/2008  | Mitsuyoshi et al. |
| 2008/0241402 | A1* | 10/2008 | Matsuoka et al. ............ 427/331 |
| 2009/0053020 | A1* | 2/2009  | Okuno .................... 414/222.01 |

FOREIGN PATENT DOCUMENTS

| JP | 5-129417 | 5/1993 |
| JP | 9-153534 | 6/1997 |
| JP | 2001-308160 | 11/2001 |
| JP | 2004-349503 | 12/2004 |
| JP | 2008-172160 | 7/2008 |
| KR | 10-2006-0037475 | 5/2006 |
| WO | 01/75965 | 10/2001 |

OTHER PUBLICATIONS

Korean Office Action (Notice of Allowance) issued Sep. 27, 2011 in connection with corresponding Korean Patent Application No. 10-2010-0005742.
Korean Office Action issued Jun. 23, 2011 in connection with corresponding Korean Patent Application No. 10-2010-0005742.

* cited by examiner

*Primary Examiner* — Yolanda Jones
(74) *Attorney, Agent, or Firm* — Ostrolenk Faber LLP

(57) ABSTRACT

A substrate processing apparatus includes: a plurality of substrate processing sections arranged alongside a transport passage; a standby mechanism which retains a substrate in standby, the standby mechanism being movable along the transport passage; a transport mechanism which transports the substrate between the standby mechanism and each of the substrate processing sections, the transport mechanism being movable along the transport passage; a first movement mechanism which moves the transport mechanism along the transport passage; and a second movement mechanism which moves the standby mechanism along the transport passage.

8 Claims, 14 Drawing Sheets

SUBSTRATE PROCESSING APPARATUS AND SUBSTRATE TRANSPORT METHOD

BACKGROUND OF THE INVENTION

1. Field of the Invention

The present invention relates to a substrate processing apparatus for processing a substrate, and to a substrate transport method for transporting a substrate. Examples of the substrate to be processed include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In production processes for a semiconductor device and a liquid crystal display device, a substrate processing apparatus of a single substrate processing type is often used, which is adapted to process a single substrate (a semiconductor wafer or a glass substrate for the liquid crystal display device) at a time (see, for example, US2008/0159832A1 and US2008/0199284A1).

A substrate processing apparatus disclosed in US2008/0159832A1 includes, as shown in FIG. 16 of the present application, an indexer block B1 and a processing block B2 which are arranged in juxtaposition. The indexer block B1 includes a carrier holder CH and an indexer robot IR1. The processing block B2 includes eight processing units U and a main robot MR1. The eight processing units U include two sets of four vertically stacked processing units U, which are disposed on opposite sides of a substrate transport passage. In FIG. 16, the uppermost two processing units U are shown. A substrate platform PASS for retaining substrates W is disposed at a junction between the indexer block B1 and the processing block B2.

The carrier holder CH is adapted to hold carriers C which each accommodate a plurality of substrates W. The carriers C are held by the carrier holder CH in alignment in a predetermined alignment direction.

The indexer robot IR1 is adapted to transfer the substrates W between any of the carriers C and the substrate platform PASS. The indexer robot IR1 is disposed adjacent the carrier holder CH. The indexer robot IR1 is movable along the carrier alignment direction.

The main robot MR1 is adapted to transport the substrates W between the substrate platform PASS and any of the processing units U. The main robot MR1 is disposed in the transport passage.

In the substrate processing apparatus disclosed in US2008-0159832A1, a substrate processing operation is performed, for example, in the following manner. First, an unprocessed substrate W is taken out of any of the carriers C, and transferred to the substrate platform PASS by the indexer robot IR1. Then, the unprocessed substrate W transferred to the substrate platform PASS is taken out of the substrate platform PASS, and loaded into any of the processing units U by the main robot MR1. The substrate W processed in the processing unit U is unloaded from the processing unit U and transported to the substrate platform PASS by the main robot MR1. Then, the processed substrate W is transferred from the substrate platform PASS into any of the carriers C by the indexer robot IR1.

On the other hand, a substrate processing apparatus disclosed in US2008/0199284A1 includes, as shown in FIG. 17 of the present application, an indexer block B1, a first processing block B2a and a second processing block B2b which are arranged in juxtaposition. The indexer block B1 includes a carrier holder CH and an indexer robot IR1. The first processing block B2a includes eight processing units U and a first main robot MR1. The second processing block B2b includes eight processing units U and a second main robot MR2. A first substrate platform PASS1 is disposed at a junction between the indexer block B1 and the first processing block B2a. A second substrate platform PASS2 is disposed at a junction between the first processing block B2a and the second processing block B2b.

The eight processing units U of the first processing block B2a include two sets of four vertically stacked processing units U, which are disposed on opposite sides of a transport passage. Similarly, the eight processing units U of the second processing block B2b include two sets of four vertically stacked processing units U, which are disposed on opposite sides of the transport passage. A total of 16 processing units U of the first and second processing blocks B2a, B2b are three-dimensionally arranged, and disposed alongside the transport passage as seen in plan.

In the substrate processing apparatus disclosed in US2008-0199284A1, a substrate processing operation is performed, for example, in the following manner. First, an unprocessed substrate W is taken out of any of the carriers C, and transferred to the first substrate platform PASS1 by the indexer robot IR1. Then, the unprocessed substrate W transferred to the first substrate platform PASS1 is taken out of the first substrate platform PASS1, and loaded into any of the processing units U of the first processing block B2a by the first main robot MR1. The substrate W processed in the processing unit U of the first processing block B2a is unloaded from the processing unit U, and transported to the first substrate platform PASS1 by the first main robot MR1. Then, the processed substrate W is transferred from the first substrate platform PASS1 into any of the carriers C by the indexer robot IR1.

Alternatively, the unprocessed substrate W transferred to the first substrate platform PASS1 by the indexer robot IR1 is further transferred to the second substrate platform PASS2 by the first main robot MR1. Then, the unprocessed substrate W transferred to the second substrate platform PASS2 is taken out of the second substrate platform PASS2, and loaded into any of the processing units U of the second processing block B2b by the second main robot MR2. The substrate W processed in the processing unit U of the second processing block B2b is unloaded from the processing unit U, and transported to the second substrate platform PASS2 by the second main robot MR2. Then, the processed substrate W transported to the second substrate platform PASS2 is transferred from the second substrate platform PASS2 to the first substrate platform PASS1 by the first main robot MR1. Then, the processed substrate W is transferred into any of the carriers C from the first substrate platform PASS1 by the indexer robot IR1.

It is conceivable to increase the number of the processing units in order to increase the throughput of the substrate processing apparatus (the number of substrates processed in a unit period). Where a plurality of processing units are provided, these processing units should be arranged vertically and/or horizontally. Where the processing units are vertically arranged, however, the substrate processing apparatus has an increased height. This may make it impossible to install the substrate processing apparatus in a clean room. Therefore, where a multiplicity of processing units are provided, these processing units should be arranged not only vertically but also horizontally.

In the substrate processing apparatus disclosed in US2008/019928A1, for example, the 16 processing units U, which are greater in number by eight than those provided in the substrate processing apparatus disclosed in US2008/0159832A1, are arranged three-dimensionally and disposed alongside the substrate transport passage as seen in plan. In the substrate processing apparatus disclosed in US2008/0199284A1, however, a longer period is required for substrate transportation by the first main robot MR1, and influences the overall substrate processing period required for the substrate processing operation to be performed by the substrate processing apparatus. This prevents improvement of the throughput of the substrate processing apparatus.

More specifically, as described above, the first main robot MR1 performs a substrate transportation operation for transporting the substrate W between the first substrate platform PASS1 and any of the processing units U, and a substrate transportation operation for transporting the substrate W between the first substrate platform PASS1 and the second substrate platform PASS2. Therefore, the total substrate transportation period required for the substrate transportation operations to be performed by the first main robot MR1 is greater than a substrate transportation period required for substrate transportation by the main robot MR1 of the apparatus disclosed in US2008/0159832A1. Therefore, the substrate transportation period required for the substrate transportation operations to be performed by the first main robot MR1 influences the overall substrate processing period required for the substrate processing operation to be performed by the substrate processing apparatus, and prevents the improvement of the throughput of the substrate processing apparatus.

Further, the two main robots provided in the substrate processing apparatus disclosed in US2008/0199284A1 are expensive, thereby increasing the costs of the substrate processing apparatus.

It is also conceivable to design the substrate processing apparatus such that the first main robot MR1 can be moved horizontally along the transport passage in order to obviate the substrate transportation between the first substrate platform PASS1 and the second substrate platform PASS2 by the first main robot MR1. This makes it possible to obviate the second main robot MR2 and the second substrate platform PASS2. With this arrangement, however, time is required for horizontally moving the first main robot MR1 along the transport passage when the substrate W is transported between the first substrate platform PASS1 and each of the processing units U, thereby increasing the substrate transportation period required for the substrate transportation by the first main robot MR1. Therefore, the substrate transportation period required for the substrate transportation by the first main robot MR1 influences the overall substrate processing period required for the substrate processing operation to be performed by the substrate processing apparatus, thereby preventing the improvement of the throughput of the substrate processing apparatus.

SUMMARY OF THE INVENTION

It is an object of the present invention to provide a substrate processing apparatus and a substrate transport method which suppress or prevent an increase in substrate transportation period even if the substrate processing apparatus includes a plurality of processing units (substrate processing sections) arranged along a transport passage.

A substrate processing apparatus according to the present invention includes: a plurality of substrate processing sections arranged alongside a transport passage; a standby mechanism which retains a substrate in standby, the standby mechanism being movable along the transport passage; a transport mechanism which transports the substrate between the standby mechanism and each of the substrate processing sections, the transport mechanism being movable along the transport passage; a first movement mechanism which moves the transport mechanism along the transport passage; and a second movement mechanism which moves the standby mechanism along the transport passage. The standby mechanism, for example, has no access means for accessing the substrate processing sections.

With this arrangement, the transport mechanism and the standby mechanism are movable along the transport passage. The first movement mechanism and the second movement mechanism move the transport mechanism and the standby mechanism, respectively, along the transport passage. When the transport mechanism transports the substrate between the standby mechanism and any of the substrate processing sections, the standby mechanism is thus moved along the transport passage by the second movement mechanism, whereby a period required for moving the transport mechanism toward the standby mechanism is reduced or obviated. Even if the substrate processing sections are arranged alongside the transport passage, it is possible to suppress or prevent an increase in a substrate transportation period required for substrate transportation by the transport mechanism. This suppresses or prevents an increase in a substrate transportation period required for substrate transportation in the substrate processing apparatus.

According to one embodiment, the substrate processing apparatus further includes a control unit which is programmed to control the first and second movement mechanisms so as to maintain the transport mechanism and the standby mechanism in a positional relationship that permits transfer of the substrate between the transport mechanism and the standby mechanism. With this arrangement, the transport mechanism and the standby mechanism are maintained in the positional relationship that permits the substrate transfer therebetween. This obviates a period during which the transport mechanism may otherwise be held in standby until the transport mechanism and the standby mechanism are brought into the positional relationship that permits the substrate transfer therebetween when the substrate is transported into or out of the standby mechanism by the transport mechanism. This ensures smooth substrate transportation by the transport mechanism, thereby suppressing or preventing the increase in the substrate transportation period required for the substrate transportation by the transport mechanism.

The distance between the transport mechanism and the standby mechanism may be a constant distance that permits the substrate transfer, or may be temporarily changed to a distance different from the distance that permits the substrate transfer. That is, when the substrate is not transferred between the transport mechanism and the standby mechanism (e.g., when the transport mechanism transports the substrate into or out of any of the substrate processing sections), the distance between the transport mechanism and the standby mechanism may be temporarily changed to the distance different from the distance that permits the substrate transfer.

According to another embodiment, the substrate processing apparatus further includes a control unit which is programmed to control the transport mechanism so as to transfer the substrate between the transport mechanism and the standby mechanism when the transport mechanism and the standby mechanism are moved along the transport passage (or, preferably, whether or not the transport mechanism and the standby mechanism are moved).

With this arrangement, the control unit is programmed so as to transfer the substrate between the transport mechanism and the standby mechanism whether or not the transport mechanism and the standby mechanism are moved along the transport passage. Therefore, the control unit can move the transport mechanism along the transport passage while permitting the transfer of the substrate between the transport mechanism and the standby mechanism. This suppresses or prevents the increase in the substrate transportation period required for the substrate transportation by the transport mechanism due to the movement of the transport mechanism along the transport passage.

The control unit may be programmed to control the transport mechanism and the first and second movement mechanisms so as to start the movement of the transport mechanism along the transport passage during the substrate transfer between the transport mechanism and the standby mechanism, and end the movement of the transport mechanism along the transport passage before the substrate transfer between the transport mechanism and the standby mechanism is completed. In this case, the movement of the transport mechanism along the transport passage is started and ended during the substrate transfer between the transport mechanism and the standby mechanism. Therefore, the movement of the transport mechanism along the transport passage can be achieved without increasing the substrate transportation period required for the substrate transportation by the transport mechanism. This prevents the increase in the substrate transportation period required for the substrate transportation by the transport mechanism due to the movement of the transport mechanism along the transport passage.

According to further another embodiment, the substrate processing apparatus further includes a container retaining portion disposed adjacent the transport passage for retaining a container for containing the substrate. Further, the standby mechanism may include a plurality of standby mechanisms, and the second movement mechanism is capable of individually moving the standby mechanisms along the transport passage. The substrate processing apparatus further includes a substrate transfer mechanism which transfers the substrate between the container retained by the container retaining portion and one of the standby mechanisms located at a predetermined transfer position defined on the transport passage, and a control unit which is programmed to control the second movement mechanism so as to cause at least one of the standby mechanisms to follow the transport mechanism at a position adjacent to the transport mechanism, and move at least another one of the standby mechanisms different from the standby mechanism following the transport mechanism between the position adjacent to the transport mechanism and the transfer position.

With this arrangement, the substrate transfer mechanism transfers the substrate between the container retained by the container retaining portion and the standby mechanism located at the predetermined transfer position defined on the transport passage. The control unit moves the respective standby mechanisms between the position adjacent to the transport mechanism and the transfer position. Further, the transport mechanism transports the substrate between any of the standby mechanisms and any of the substrate processing sections. Therefore, the substrate is transported between any of the substrate processing sections and the container retained by the container retaining portion through the substrate transfer by the substrate transfer mechanism, the movement of the respective standby mechanisms along the transport passage and the substrate transportation by the transport mechanism.

The control unit controls the second movement mechanism so as to cause the at least one standby mechanism to follow the transport mechanism at the position adjacent to the transport mechanism. That is, the at least one standby mechanism follows the transport mechanism at the position adjacent to the transport mechanism during the substrate transportation by the transport mechanism. Therefore, the transport mechanism and the standby mechanism are constantly maintained in the positional relationship that permits the substrate transfer therebetween during the substrate transportation by the transport mechanism. This ensures smooth substrate transportation by the transport mechanism.

The control unit controls the second movement mechanism so that the at least another one of the standby mechanisms different from the standby mechanism following the transport mechanism is moved between the position adjacent to the transport mechanism and the transfer position. That is, the control unit causes the standby mechanism different from the standby mechanism following the transport mechanism to transport the substrate between the position adjacent to the transport mechanism and the transfer position, or locates the standby mechanism different from the standby mechanism following the transport mechanism at the transfer position to cause the substrate transfer mechanism to transfer the substrate. Thus, the standby mechanisms efficiently work, so that the substrate can be efficiently transported between the container retained by the container retaining portion and any of the substrate processing sections.

The standby mechanism preferably includes at least three standby mechanisms. In this case, the control unit is preferably programmed to control the second movement mechanism so that at least one of the standby mechanisms follows the transport mechanism at the position adjacent to the transport mechanism, and at least another one of the standby mechanisms different from the standby mechanism following the transport mechanism is located at the transfer position, and the other at least one standby mechanism is moved between the position adjacent to the transport mechanism and the transfer position.

With this arrangement, the at least one standby mechanism follows the transport mechanism at the position adjacent to the transport mechanism, so that the transport mechanism and the standby mechanism are constantly maintained in the positional relationship that permits the substrate transfer therebetween. This ensures smooth substrate transportation by the transport mechanism.

Further, the at least another one standby mechanism different from the standby mechanism following the transport mechanism is located at the transfer position. This ensures smooth substrate transfer by the substrate transfer mechanism.

Furthermore, the other at least one standby mechanism is moved between the position adjacent to the transport mechanism and the transfer position. Therefore, the control unit ensures efficient substrate transportation between the container retained by the container retaining portion and any of the substrate processing sections. For example, the substrate can be transported between the position adjacent to the transport mechanism and the transfer position during the substrate transportation by the transport mechanism and the substrate transfer by the substrate transfer mechanism.

The standby mechanism further preferably includes at least four standby mechanisms. In this case, the control unit is preferably programmed to control the second movement mechanism so that at least one of the standby mechanisms follows the transport mechanism at the position adjacent to the transport mechanism, and at least another one of the standby mechanisms different from the standby mechanism following the transport mechanism is located at the transfer position, and the other at least two standby mechanisms are moved between the position adjacent to the transport mechanism and the transfer position.

With this arrangement, the at least one standby mechanism follows the transport mechanism at the position adjacent to the transport mechanism, so that the transport mechanism and the standby mechanism are constantly maintained in the positional relationship that permits the substrate transfer therebetween. This ensures smooth substrate transportation by the transport mechanism.

Further, the at least another one standby mechanism different from the standby mechanism following the transport mechanism is located at the transfer position. This ensures smooth substrate transfer by the substrate transfer mechanism.

Furthermore, the other at least two standby mechanisms are moved between the position adjacent to the transport mechanism and the transfer position. Therefore, the control unit ensures smooth substrate transportation operation by the transport mechanism and smooth substrate transfer by the substrate transfer mechanism. More specifically, even if the standby mechanism located at the position adjacent to the transport mechanism and the standby mechanism located at the transfer position are simultaneously replaced with other standby mechanisms, for example, the replacement can be smoothly achieved. This ensures smooth substrate transportation by the transport mechanism and smooth substrate transfer by the substrate transfer mechanism.

According to still another embodiment, the standby mechanism includes a plurality of standby mechanisms, and the second movement mechanism is capable of individually moving the standby mechanisms. The standby mechanisms are arranged in non-overlapping relation so as to be offset from each other in a direction crossing a standby mechanism movement direction as seen in the standby mechanism movement direction.

With this arrangement, the standby mechanisms are arranged in non-overlapping relation so as to be offset from each other in the direction crossing the standby mechanism movement direction as seen in the standby mechanism movement direction. Therefore, the standby mechanisms are movable without interference with each other. Thus, the second movement mechanism can smoothly move the respective standby mechanisms along the transport passage.

Where the transport passage extends horizontally, for example, the standby mechanisms may be offset from each other in a horizontal direction crossing the transport passage, or may be offset from each other in a vertical direction. In this case, with the standby mechanisms being offset from each other in the vertical direction, the second movement mechanism can smoothly move the respective standby mechanisms along the transport passage, and the overall footprint of the standby mechanisms (the total area occupied by the standby mechanisms) can be reduced.

The standby mechanism preferably includes a standby substrate inverting mechanism which inverts the substrate retained in standby.

With this arrangement, the substrate retained in standby in the standby mechanism can be inverted by the standby substrate inverting mechanism of the standby mechanism. Therefore, the transport mechanism can load the inverted substrate into any of the substrate processing sections. This makes it possible to process one or both of opposite surfaces of the substrate. Since the standby mechanism includes the mechanism for inverting the substrate, the inversion of the substrate can be achieved without increasing the substrate transportation period required for the substrate transportation by the transport mechanism.

The transport mechanism preferably includes an inversion mechanism which inverts the substrate held by the transport mechanism. With this arrangement, the substrate held by the transport mechanism can be inverted by the inversion mechanism of the transport mechanism. Therefore, the transport mechanism can invert the substrate, and then load the inverted substrate into any of the substrate processing sections. This makes it possible to process one or both of the opposite surfaces of the substrate. Since the transport mechanism includes the mechanism for inverting the substrate, the respective standby mechanisms can be moved for efficient operation by the second movement mechanism, for example, during the inversion of the transport mechanism. This ensures smooth substrate transportation in the substrate processing apparatus.

The substrate processing sections may each include a substrate holding mechanism which holds the substrate, and a processing chamber in which the substrate holding mechanism is accommodated. The processing chambers of the respective substrate processing sections are preferably uniform in shape and size. The substrate holding mechanisms of the respective substrate processing sections are preferably disposed in the same positional relation to the corresponding processing chambers so as to be each located at a predetermined position spaced from a center of the corresponding processing chamber parallel to the transport passage.

With this arrangement, the processing chambers of the respective substrate processing sections are uniform in shape and size, and the substrate holding mechanisms of the respective substrate processing sections are disposed in the same positional relation to the corresponding processing chambers so as to be each located at the predetermined position spaced from the center of the corresponding processing chamber parallel to the transport passage. That is, the specifications of the substrate processing sections are at least partly commonized. This makes it possible to easily design and produce the substrate processing sections and share their parts, thereby correspondingly reducing the production costs.

Where two substrate processing sections are disposed on opposite sides of the transport passage, for example, substrate holding mechanisms of the two substrate processing sections are offset from each other parallel to the transport passage, because the substrate holding mechanisms of the respective substrate processing sections are disposed in the same positional relation to the corresponding processing chambers so as to be each located at the predetermined position spaced from the center of the corresponding processing chamber parallel to the transport passage. When substrates are to be transferred between the transport mechanism and the two substrate holding mechanisms, the first movement mechanism should move the transport mechanism along the transport passage. According to the present invention, however, the second movement mechanism moves the standby mechanism along the transport passage, whereby the transport load of the transport mechanism is alleviated. This suppresses or prevents the increase in the substrate transportation period required for the substrate transportation by the transport mechanism, making it possible to easily design and produce the substrate processing sections.

A substrate transport method according to the present invention includes a standby mechanism moving step of moving a standby mechanism along a predetermined transport passage provided alongside a plurality of substrate processing sections, the standby mechanism being adapted to retain a substrate in standby; a transport mechanism moving step of moving a transport mechanism along the transport passage, the transport mechanism being adapted to transport the substrate; and a transporting step of causing the transport mechanism to transport the substrate between any of the substrate processing sections and the standby mechanism.

The substrate transport method preferably further includes a position maintaining step of maintaining the transport mechanism and the standby mechanism in a positional relationship that permits substrate transfer between the transport mechanism and the standby mechanism.

The transporting step preferably includes a mid-movement transferring step of transferring the substrate between the transport mechanism and the standby mechanism while moving the transport mechanism and the standby mechanism along the transport passage.

A container retaining portion which retains a container for containing the substrate may be provided adjacent the transport passage. In this case, the standby mechanism preferably includes a plurality of standby mechanisms which are individually movable along the transport passage, and the substrate transport method preferably further includes the steps of: causing a substrate transfer mechanism to transfer the substrate between any of the standby mechanisms and the container retained by the container retaining portion at a predetermined transfer position on the transport passage; causing at least one of the standby mechanisms to follow the transport mechanism at a position adjacent to the transport mechanism; and moving at least another one of the standby mechanisms different from the standby mechanism following the transport mechanism between the position adjacent to the transport mechanism and the transfer position.

The standby mechanism preferably includes at least three standby mechanisms. In this case, the substrate transport method preferably further includes the steps of: locating the at least another one of the standby mechanisms different from the standby mechanism following the transport mechanism at the transfer position; and moving the other at least one of the standby mechanisms between the position adjacent to the transport mechanism and the transfer position.

The standby mechanism preferably includes at least four standby mechanisms. In this case, the substrate transport method preferably further includes the steps of: locating the at least another one of the standby mechanisms different from the standby mechanism following the transport mechanism at the transfer position; and moving the other at least two of the standby mechanisms between the position adjacent to the transport mechanism and the transfer position.

The substrate transport method preferably further includes the step of moving the standby mechanisms individually along the transport passage, the standby mechanisms being offset from each other in a direction crossing a standby mechanism movement direction on the transport passage.

The substrate transport method preferably further includes the step of inverting the substrate retained in standby by the standby mechanism.

The substrate transport method preferably further includes the step of inverting the substrate held by the transport mechanism.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
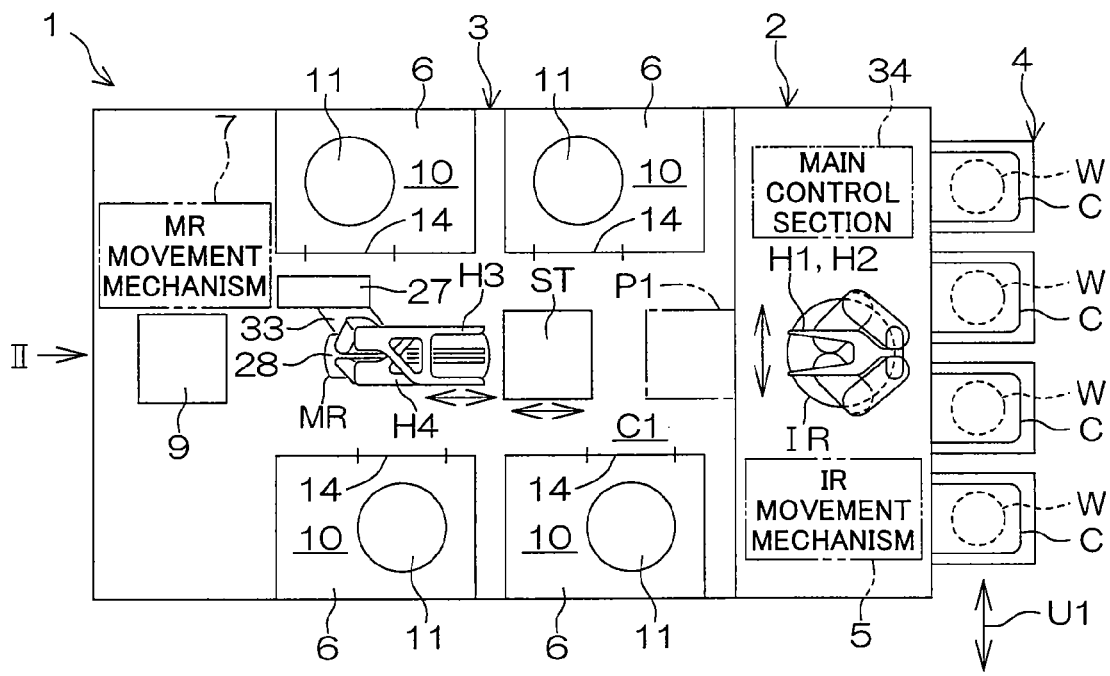
FIG. 1 is a schematic plan view showing a layout in a substrate processing apparatus according to a first embodiment of the present invention.
Figure 2:
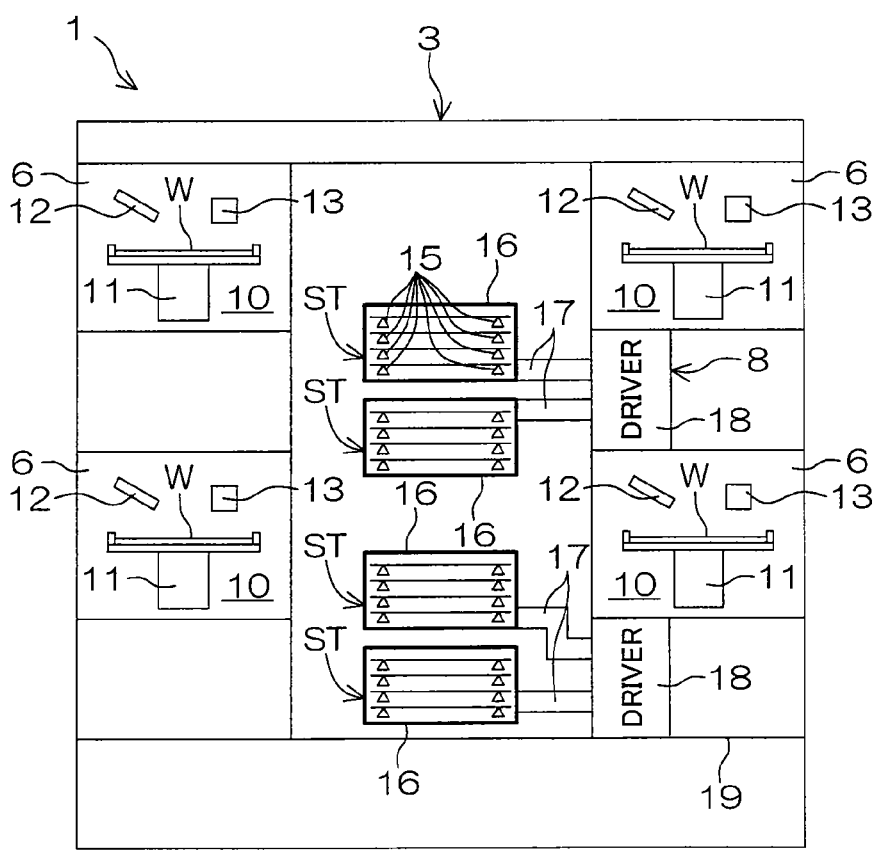
FIG. 2 is a schematic side view of the substrate processing apparatus as seen in an arrow direction II in FIG. 1.

FIG. 1 is a schematic plan view showing a layout in a substrate processing apparatus 1 according to a first embodiment of the present invention. FIG. 2 is a schematic side view of the substrate processing apparatus 1 as seen in an arrow direction II in FIG. 1. In FIG. 2, some components (a main robot MR and an inversion unit 9 to be described later) of the substrate processing apparatus 1 are not shown.

The substrate processing apparatus 1 is of a single substrate processing type which is adapted to process a single substrate W (a semiconductor wafer or the like) at a time. The substrate processing apparatus 1 includes an indexer block 2, and a processing block 3 connected to the indexer block 2.

The indexer block 2 includes a carrier retaining portion 4 (container retaining portion), an indexer robot IR (substrate transfer mechanism), and an indexer robot movement mechanism 5 (hereinafter referred to as "IR movement mechanism 5"). The carrier retaining portion 4 retains a plurality of carriers C (containers) which are each capable of accommodating a plurality of substrates W. The carriers C are retained by the carrier retaining portion 4 as being aligned in a horizontal direction (hereinafter referred to as "carrier alignment direction U1"). The IR movement mechanism 5 horizontally moves the indexer robot IR along the carrier alignment direction U1. In each of the carriers C, the substrates W are accommodated with their front surfaces (device formation surfaces) facing up.

The indexer robot IR includes a first upper hand H1 and a first lower hand H2. The first upper hand H1 and the first lower hand H2 have substantially the same fork shape. The first upper hand H1 and the first lower hand H2 are horizontally disposed at different height positions in vertically offset relation so as not to interfere with each other. In FIG. 1, the first upper hand H1 and the first lower hand H2 are illustrated as vertically overlapping each other. The first upper hand H1 and the first lower hand H2 are each capable of horizontally retaining a single substrate W from the below.

The indexer robot IR is capable of transporting a substrate W into and out of any of the carriers C with its first upper and lower hands H1, H2 opposed to the carrier C. The IR movement mechanism 5 moves the indexer robot IR along the carrier alignment direction U1, whereby the indexer robot IR can transport the substrate W into and out of any of the carriers C. Further, the indexer robot IR is capable of transporting the substrate W into and out of any of a plurality of shuttles ST to be described later. Therefore, the indexer robot IR can transfer the substrate W between any of the carriers C and any of the shuttles ST.

The processing block 3 is connected to a side of the indexer block 2 opposite from the carrier retaining portion 4. The processing block 3 includes a plurality of processing units 6 (substrate processing sections) which each process a single substrate W at a time, a main robot MR (transport mechanism), the plurality of shuttles ST (standby mechanisms), a main robot movement mechanism 7 (first movement mechanism, hereinafter referred to as "MR movement mechanism 7"), a shuttle movement mechanism 8 (second movement mechanism), and an inversion unit 9 which inverts a substrate W. In this embodiment, eight processing units 1 are provided, each two of which are vertically stacked. These processing units 1 are arranged alongside a transport passage C1. The transport passage C1 linearly extends in a horizontal direction perpendicular to the cassette alignment direction U1. The eight processing units 6 are arranged in two rows which are horizontally opposed to each other with the intervention of the transport passage C1. Four of the eight processing units 6 disposed adjacent the indexer block 2 define one block, and the other four processing units 6 define the other block.

The main robot MR is disposed in the transport passage C1. The main robot MR is horizontally movable along the transport passage C1. The shuttles ST are disposed closer to the indexer block 2 than the main robot MR in the transport passage C1. In this embodiment, for example, four shuttles ST are provided as shown in FIG. 2. The shuttles ST are disposed at different height positions in vertically offset relation so as not to overlap each other as seen horizontally. The shuttles ST are horizontally movable along the transport passage C1. Further, as shown in FIG. 1, the inversion unit 9 is disposed at the farthermost position from the indexer block 2 on the transport passage C1.

The MR movement mechanism 7 horizontally moves the main robot MR along the transport passage C1. Further, the shuttle movement mechanism 8 horizontally moves the shuttles ST individually between a position adjacent to the main robot MR and a predetermined transfer position P1 along the transport passage C1. At the transfer position P1, the substrate W is transferred between the indexer robot IR and any of the shuttles ST. In this embodiment, for example, the transfer position P1 is located closest to the indexer block 2 on the transport passage C1.

The processing units 6 are each adapted to perform a variety of processing operations such as cleaning, etching and liftoff treatments on the substrate W. As shown in FIG. 2, the processing units 6 each include a spin chuck 11 (substrate holding mechanism) which horizontally holds and rotates a single substrate W, a treatment liquid nozzle 12 which spouts a treatment liquid toward an upper surface of the substrate W held by the spin chuck 11, and a brush 13 for cleaning the upper surface of the substrate W. The spin chuck 11, the treatment liquid nozzle 12 and the brush 13 are provided in a processing chamber 10 defined by partition walls.

The processing chambers 10 of the eight processing units 6 each have a box shape having a rectangular plan shape, for example, and have the same size. That is, the processing chambers 10 of the eight processing units 6 are uniform in size and shape. The spin chucks 11 of the eight processing units 6 are disposed in the same positional relation to the corresponding processing chambers 10 so as to be each located at a predetermined position spaced from a center of the corresponding processing chamber 10 parallel to the transport passage C1. As shown in FIG. 1, the processing units 6 each have an opening through which the substrate W is loaded into and unloaded out of the processing chamber 10, and a door 14 which covers and uncovers the opening. The processing units 6 are each disposed with the door 14 thereof facing toward the transport passage C1. Therefore, the spin chucks 11 of each two processing units 6 horizontally opposed to each other with the intervention of the transport passage C1 are offset from each other parallel to the transport passage C1.

The spin chuck 11 is adapted to horizontally hold a single substrate W and rotate the substrate W about a vertical axis extending through a center of the substrate W. The spin chuck 11 may be of a periphery holding type which is adapted to hold a peripheral edge of the substrate W, or may be of a vacuum suction type which is adapted to hold the substrate W by vacuum suction of a lower surface (rear surface) of the substrate W. The treatment liquid nozzle 12 is disposed so that the spouted treatment liquid is applied onto a center portion of the upper surface of the substrate W held by the spin chuck 11. The brush 13 is adapted to be pressed against the upper surface of the substrate W held by the spin chuck 11 and, in this state, moved between the upper surface center portion and an upper surface peripheral edge of the substrate W on the upper surface of the substrate W.

When the substrate W is processed by any of the processing units 6, for example, the spin chuck 11 rotates the substrate W about the vertical axis. Further, the treatment liquid (e.g., a rinse liquid such as deionized water is spouted from the treatment liquid nozzle 12 toward the upper surface center portion of the rotating substrate W. Further, the brush 13 is pressed against the upper surface of the rotating substrate W. In this state, the brush 13 is moved between the upper surface center portion and the upper surface peripheral edge of the substrate W on the upper surface of the substrate W. Thus, the upper surface of the substrate W is rubbed with the brush 13 to be thereby treated (subjected to a scrub cleaning process).

The main robot MR includes a second upper hand H3 and a second lower hand H4. The second upper hand H3 and the second lower hand H4 have substantially the same fork shape. The second upper hand H3 and the second lower hand H4 are horizontally disposed at different height positions in vertically offset relation so as not to interfere with each other. In FIG. 1, the second upper hand H3 and the second lower hand H4 are illustrated as vertically overlapping each other. The second upper hand H3 and the second lower hand H4 are each capable of horizontally retaining a single substrate W from the below.

The main robot MR is capable of transporting the substrate W into and out of any of the processing units 6 with its first upper and lower hands H3, H4 opposed to the processing unit 6. The MR movement mechanism 7 horizontally moves the main robot MR along the transport passage C1, whereby the main robot MR can transport the substrate W into and out of any of the processing units 6. Further, the main robot MR is capable of transporting the substrate W into and out of one of the shuttles ST located adjacent the main robot MR. Therefore, the main robot MR can transfer the substrate W between any of the processing units 6 and any of the shuttles ST.

The shuttles ST are each adapted to retain a substrate W in standby. As shown in FIG. 2, the shuttles ST each include a plurality of support members 15 and a casing 16. The support members 15 can horizontally hold a plurality of substrates W in a vertically spaced manner. The casings 16 of the respective shuttles ST are disposed at different height positions in vertically offset relation so as not to overlap each other as seen horizontally. The casing 16 has a tubular shape, for example, having a rectangular section, and has two openings facing toward the indexer robot IR and the main robot MR, respectively. The indexer robot IR is capable of transporting a substrate W into and out of any of the shuttles ST by advancing the first upper hand H1 and the first lower hand H2 into the casing 16 of the shuttle ST through one of the openings of the casing 16. Further, the main robot MR is capable of transporting a substrate W into and out of any of the shuttles ST by advancing the second upper hand H3 and the second lower hand H4 into the casing 16 of the shuttle ST through the other opening of the casing 16. The casings 16 of the respective shuttles ST are connected to the shuttle movement mechanism 8 via support arms 17, respectively.

The shuttle movement mechanism 8 includes, for example, two drivers 18. The drivers 18 are fixed to a frame 19 of the substrate processing apparatus 1. Upper two of the casings 16 are connected to an upper one of the drivers 18 via two of the support arms 17. Therefore, the upper two casings 16 are supported at predetermined height positions via the two support arms 17 and the upper driver 18 by the frame 19. Further, lower two of the casings 16 are connected to a lower one of the drivers 18 via two of the support arms 17. Therefore, the lower two casings 16 are supported at predetermined height positions via the two support arms 17 and the lower driver 18 by the frame 19. Though not shown, the drivers 18 each include linear guides which horizontally guide the support arms 17 along the transport passage C1, and a drive mechanism which horizontally moves the support arms 17 along the transport passage C1. Examples of the driver mechanism include a belt mechanism including an endless belt and a motor, and a ball screw mechanism including a ball screw, a ball nut, a plurality of balls and a motor.

The substrate processing apparatus 1 according to the first embodiment is capable of selectively processing one of the front and rear surfaces of the substrate W. Further, the substrate processing apparatus 1 is capable of processing both of the front and rear surfaces of the substrate W. Where the substrate processing apparatus 1 performs a substrate front surface processing operation, for example, the indexer robot IR transfers unprocessed substrates W one by one from any of the carriers C into one of the shuttles ST located at the transfer position P1, whereby the unprocessed substrates W are retained in the shuttle ST. Then, the shuttle movement mechanism 8 moves the shuttle ST retaining the unprocessed substrates W to the position adjacent to the main robot MR, and causes the shuttle ST to follow the main robot MR. Thereafter, the main robot MR successively loads the unprocessed substrates W into the respective processing units 6 from the shuttle ST, whereby the front surfaces of the substrates are processed.

After the processing of the front surfaces of the substrates W, the main robot MR unloads the processed substrates W from the respective processing units 6 into the shuttle ST. Thereafter, the shuttle movement mechanism 8 moves the shuttle ST following the main robot MR toward the transfer position P1. Then, the indexer robot IR transfers the processed substrates W into any of the carriers C from the shuttle ST located at the transfer position P1. Thus, the processing of the front surfaces of the substrates W is completed in the substrate processing apparatus 1.

Where the substrate processing apparatus 1 performs a substrate rear surface processing operation, for example, the indexer robot IR transfers unprocessed substrates W one by one from any of the carriers C into one of the shuttles ST located at the transfer position P1, whereby the unprocessed substrates W are retained in the shuttle ST. Then, the shuttle movement mechanism 8 moves the shuttle ST retaining the unprocessed substrates W to the position adjacent to the main robot MR, and causes the shuttle ST to follow the main robot MR. Thereafter, the MR movement mechanism 7 moves the main robot MR to a position adjacent to the inversion unit 9, and the main robot MR transports one of the substrates W to the inversion unit 9 from the shuttle ST, whereby the substrate W is inverted with its rear surface facing up. After the inversion, the substrate W is transported out of the inversion unit 9 with its rear surface facing up, and loaded into any of the processing units 6 by the main robot MR. In this manner, the unprocessed substrates W retained in the shuttle ST are successively loaded into the respective processing units 6, whereby the rear surfaces of the substrates W are processed.

After the processing of the rear surfaces of the substrates W, the main robot MR unloads the processed substrates W from the respective processing units 6. Then, the MR movement mechanism 7 moves the main robot MR to the position adjacent to the inversion unit 9, and the main robot MR transports one of the processed substrates W to the inversion unit 9, whereby the substrate W is inverted with its front surface facing up. After the inversion, the substrate W is transported out of the inversion unit 9 with its front surface facing up, and loaded into the shuttle ST following the main robot MR by the main robot MR. In this manner, the substrates W are successively transported into the shuttle ST following the main robot MR. Thereafter, the shuttle movement mechanism 8 moves the shuttle ST following the main robot MR toward the transfer position P1. Then, the indexer robot IR transfers the processed substrates W into any of the carriers C from the shuttle ST located at the transfer position P1, whereby the processing of the rear surfaces of the substrates W is completed in the substrate processing apparatus 1.

Where the substrate processing apparatus 1 performs a substrate front and rear surface processing operation, for example, the indexer robot IR transfers unprocessed substrates W one by one from any of the carriers C to one of the shuttles ST located at the transfer position P1, whereby the unprocessed substrates W are retained in the shuttle ST. Then, the shuttle movement mechanism 8 moves the shuttle ST retaining the unprocessed substrates W to the position adjacent to the main robot MR, and causes the shuttle ST to follow the main robot MR. Thereafter, the MR transfer mechanism 7 moves the main robot MR to the position adjacent to the inversion unit 9, and the main robot MR transports one of the substrates W to the inversion unit 9 from the shuttle ST, whereby the substrate W is inverted with its rear surface facing up. After the inversion, the substrate W is transported out of the inversion unit 9 with its rear surface facing up, and loaded into any of the processing units 6. In this manner, the unprocessed substrates W retained in the shuttle ST are successively loaded into the respective processing units 6, whereby the rear surfaces of the substrates W are processed.

After the processing of the rear surfaces of the substrates W, the main robot MR unloads the processed substrates W from the respective processing units 6. Then, the MR movement mechanism 7 moves the main robot MR to the position adjacent to the inversion unit 9, and the main robot MR transports one of the processed substrates W into the inversion unit 9, whereby the substrate W is inverted with its front surface facing up. After the inversion, the substrate W is transported out of the inversion unit 9 with its front surface facing up, and loaded into any of the processing units 6 by the main robot MR. In this manner, the substrates W are loaded into the respective processing units 6 with their front surfaces facing up, whereby the front surfaces of the substrates W are processed.

After the processing of the front surfaces of the substrates W, the main robot MR successively unloads the processed substrates W from the respective processing units 6 into the shuttle ST. Thereafter, the shuttle movement mechanism 8 moves the shuttle ST following the main robot MR toward the transfer position P1. Then, the indexer robot IR transfers the processed substrates W into any of the carriers C from the shuttle ST located at the transfer position P1, whereby the processing of the front surfaces and the rear surfaces of the substrates W is completed in the substrate processing apparatus 1.

Figure 3:
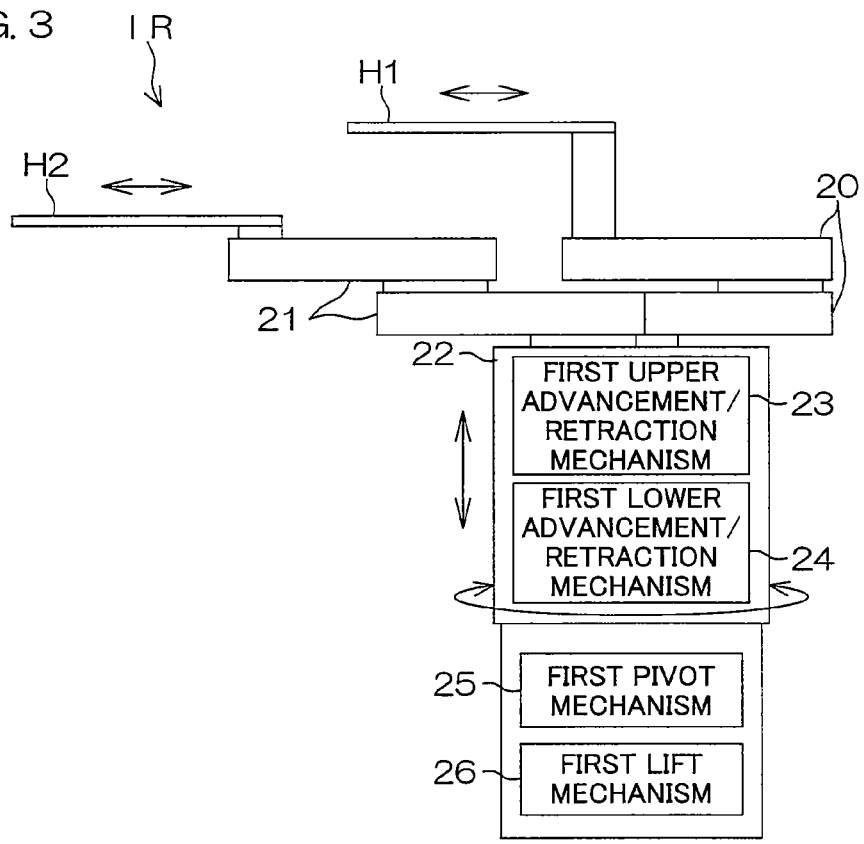
FIG. 3 is a schematic side view of an indexer robot.

FIG. 3 is a schematic side view of the indexer robot IR.

The indexer robot IR includes the first upper hand H1, the first lower hand H2, a first upper arm 20, a first lower arm 21 and a first base 22. The first upper arm 20 and the first lower arm 21 are polyarticular arms. One-side ends of the first upper arm 20 and the first lower arm 21 are attached to the first base 22. The first upper hand H1 and the first lower hand H2 are attached to the other ends of the first upper arm 20 and the first lower arm 21, respectively. The first upper hand H1 and the first lower hand H2 are supported by the first base 22 via the first upper arm 20 and the first lower arm 21. The first upper hand H1 and the first lower hand H2 are horizontally disposed above the first base 22.

A first upper advancement/retraction mechanism 23 which stretches and flexes the first upper arm 20 to horizontally advance and retract the first upper hand H1, a first lower advancement/retraction mechanism 24 which stretches and flexes the first lower arm 21 to horizontally advance and retract the first lower hand H2, a first pivot mechanism 25 which pivots the first base 22 about a vertical axis, and a first lift mechanism 26 which vertically moves up and down the first base 22 are incorporated in the indexer robot IR. The first upper advancement/retraction mechanism 23 and the first lower advancement/retraction mechanism 24 independently advance and retract the first upper arm 20 and the first lower arm 21, respectively. The first upper hand H1 is advanced and retracted at a higher position than the first lower hand H2. The first upper hand H1 and the first lower hand H2 vertically overlap each other (see FIG. 1) in an initial state in which the first upper arm 20 and the first lower arm 21 are retracted above the first base 22.

The first pivot mechanism 25 pivots the first base 22 about the vertical axis, whereby the first upper hand H1 and the first lower hand H2 are unitarily pivoted about the vertical axis.

Further, the first lift mechanism 26 vertically moves up and down the first base 22, whereby the first upper hand H1 and the first lower hand H2 are unitarily vertically moved up and down. Therefore, with the indexer robot IR being located in front of any of the carriers C, the first upper hand H1 and the first lower hand H2 are pivoted and/or moved up and down by the first pivot mechanism 25 and the first lift mechanism 26 to be thereby opposed to the carrier C. Similarly, with the indexer robot IR being located in front of the shuttle ST located at the transfer position P1, the first upper hand H1 and the first lower hand H2 are pivoted and/or moved up and down by the first pivot mechanism 25 and the first lift mechanism 26 to be thereby opposed to the shuttle ST located at the transfer position P1.

Figure 4:
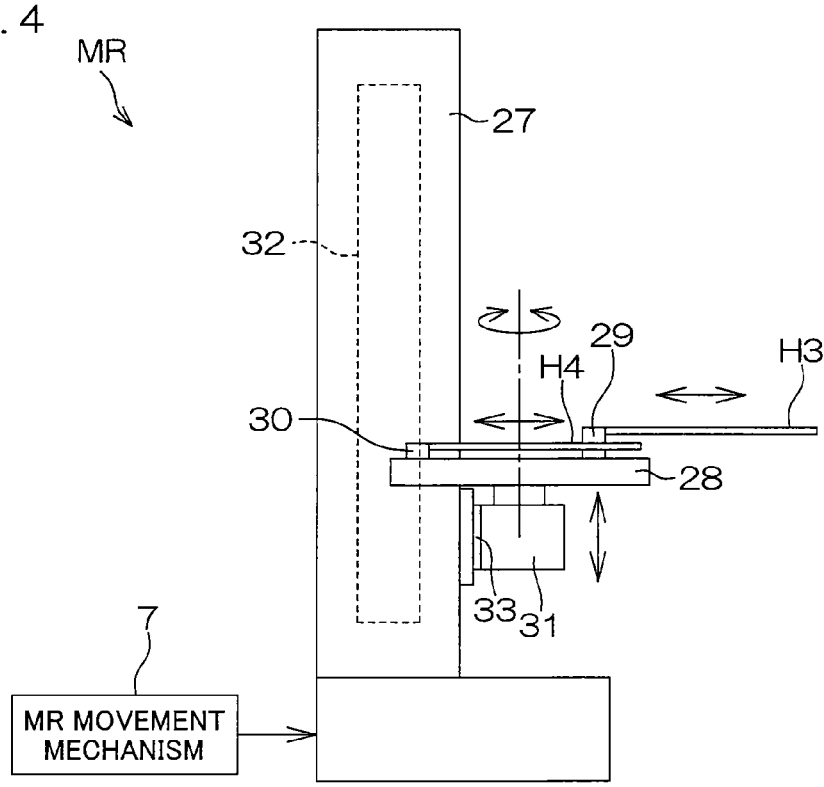
FIG. 4 is a schematic side view of a main robot.

FIG. 4 is a schematic side view of the main robot MR.

The main robot MR includes the second upper hand H3, the second lower hand H4, a robot body 27, a second base 28 which supports the second upper hand H3 and the second lower hand H4, a second upper advancement/retraction mechanism 29 and a second lower advancement/retraction mechanism 30 which advance and retract the second upper hand H3 and the second lower hand H4, respectively, a second pivot mechanism 31 which pivots the second base 28 about a vertical axis, and a second lift mechanism 32 which vertically moves up and down the second base 28. The MR movement mechanism 7 is adapted to horizontally move the robot body 27 along the transport passage C1.

The second upper hand H3 and the second lower hand H4 are horizontally disposed above the second base 28. The second upper hand H3 and the second lower hand H4 are horizontally movable with respect to the second base 28. The second base 28 is connected to the second pivot mechanism 31, which is further connected to the second lift mechanism 32 via a support arm 33. The second lift mechanism 32 is incorporated in the robot body 27.

The second upper advancement/retraction mechanism 29 horizontally advances and retracts the second upper hand H3. The second lower advancement/retraction mechanism 30 horizontally moves the second lower hand H4. The second upper advancement/retraction mechanism 29 and the second lower advancement/retraction mechanism 30 independently advance and retract the second upper hand H3 and the second lower hand H4, respectively. The second upper hand H3 is advanced and retracted above the second lower hand H4. The second upper hand H3 and the second lower hand H4 are initially disposed in vertically overlapping relation (see FIG. 1).

The second pivot mechanism 31 pivots the second base 28 about the vertical axis, whereby the second upper hand H3 and the second lower hand H4 are unitarily pivoted about the vertical axis. Further, the second lift mechanism 32 vertically moves up and down the second base 28, whereby the second upper hand H3 and the second lower hand H4 are unitarily vertically moved up and down. Therefore, with the main robot MR being located in front of any of the processing units 6, the second upper hand H3 and the second lower hand H4 are pivoted and/or lifted by the second pivot mechanism 31 and the second lift mechanism 32 to be thereby opposed to the processing unit 6. Similarly, with the shuttle ST being located at the position adjacent to the main robot MR, the second upper hand H3 and the second lower hand H4 are pivoted and/or lifted by the second pivot mechanism 31 and the second lift mechanism 32 to be thereby opposed to the shuttle ST located at the position adjacent to the main robot MR.

Figure 5:
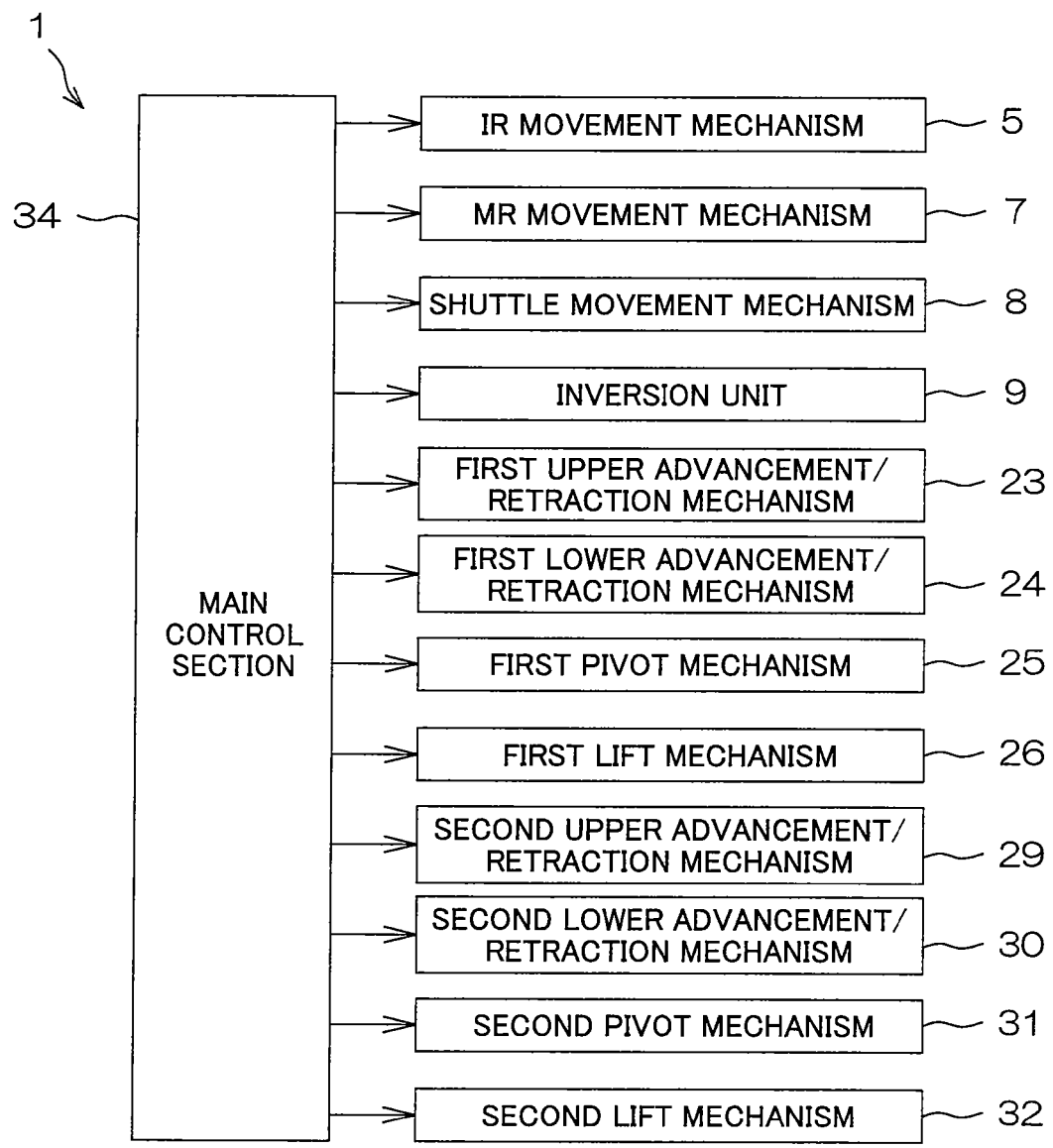
FIG. 5 is a block diagram for explaining the electrical construction of the substrate processing apparatus.

FIG. 5 is a block diagram for explaining the electrical construction of the substrate processing apparatus 1.

The substrate processing apparatus 1 includes a main control section 34 (control unit) including a microcomputer. The main control section 34 is programmed so as to control operations of the IR movement mechanism 5, the MR movement mechanism 7, the shuttle movement mechanism 8, the inversion unit 9, the first upper advancement/retraction mechanism 23, the first lower advancement/retraction mechanism 24, the first pivot mechanism 25, the first lift mechanism 26, the second upper advancement/retraction mechanism 29, the second lower advancement/retraction mechanism 30, the second pivot mechanism 31, the second lift mechanism 32 and the like.

FIGS. 6A to 6F are schematic plan views of major portions of the substrate processing apparatus 1 for explaining exemplary substrate transportation by the main robot MR. With reference to FIG. 1 and FIGS. 6A to 6F, description will be given to exemplary substrate transportation to be carried out by the main robot MR when a substrate front surface processing operation is performed.

Figure 6A:
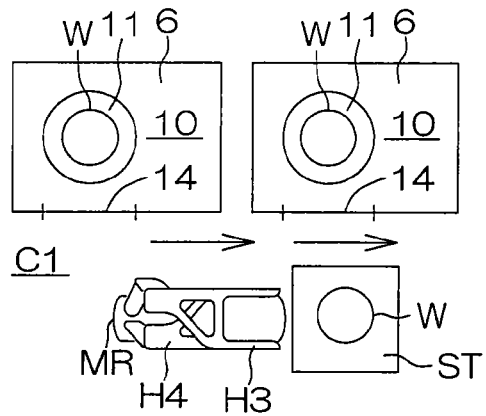
FIGS. 6A to 6F are schematic plan views of major portions of the substrate processing apparatus for explaining exemplary substrate transportation by the main robot.

When a substrate W is transported by the main robot MR, the main control section 34 moves the main robot MR to the front of any of the processing units 6. More specifically, as shown in FIG. 6A, the main control section 34 horizontally moves the main robot MR toward any of the processing units 6 along the transport passage C1 with no substrate W held by the second upper hand H3 and the second lower hand H4. At this time, as shown in FIG. 6A, the main control section 34 horizontally moves one of the shuttles ST retaining a plurality of unprocessed substrates W along the transport passage C1, and causes the shuttle ST to follow the main robot MR at the position adjacent to the main robot MR. That is, the main control section 34 causes the single shuttle ST to follow the main robot MR to maintain the main robot MR and the shuttle ST in a positional relationship that permits substrate transfer between the main robot MR and the shuttle ST.

Figure 6B:
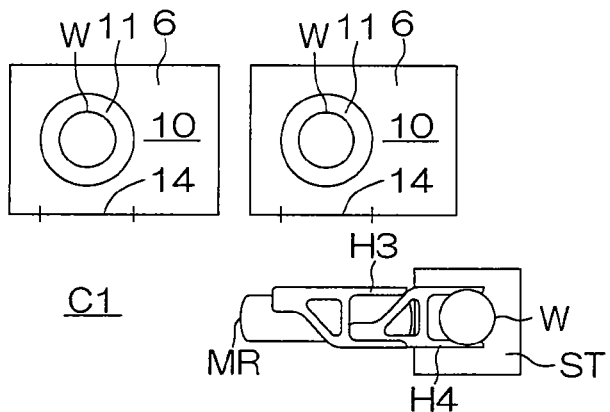

In turn, the main control section 34 causes the main robot MR to transfer an unprocessed substrate W between the shuttle ST and the main robot MR. More specifically, when the main robot MR reaches the front of the processing unit 6, the main control section 34 pivots and/or vertically moves the second upper hand H3 and the second lower hand H4 unitarily to bring the second upper hand H3 and the second lower hand H4 into opposed relation to the shuttle ST following the main robot MR. Immediately after the second upper hand H3 and the second lower hand H4 are brought into opposed relation to the shuttle ST, the main control section 34 advances the second lower hand H4 toward the shuttle ST, and locates the second lower hand H4 below one of the unprocessed substrates W retained in the shuttle ST as shown in FIG. 6B. Thereafter, the main control section 34 slightly moves up the second lower hand H4 to lift the unprocessed substrate W retained in the shuttle ST by means of the second lower hand H4. Then, the main control section 34 retracts the second lower hand H4 from the shuttle ST to transport the substrate W out of the shuttle ST. In this embodiment, the main robot MR and the shuttle ST are maintained in the positional relationship that permits the substrate transfer, so that the main robot MR can smoothly transport the substrate W. This suppresses an increase in a substrate transportation period required for substrate transportation by the main robot MR.

Figure 6C:
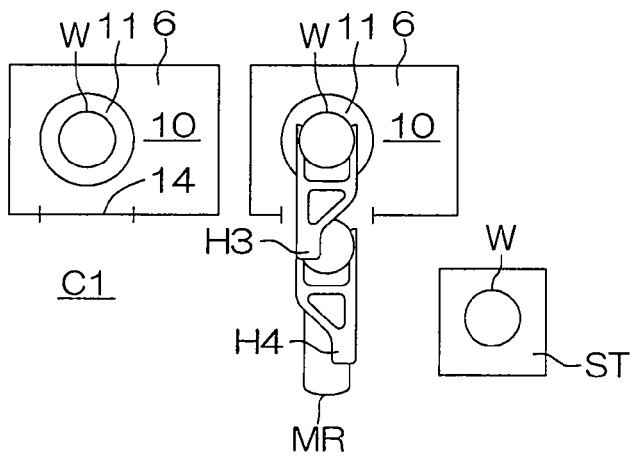

Subsequently, the main control section 34 causes the main robot MR to transfer a processed substrate W and the unprocessed substrate W between the processing unit 6 and the main robot MR. More specifically, the main control section 34 pivots and/or vertically moves the second upper hand H3 and the second lower hand 114 at the fixed position (without horizontal movement of the main robot MR) to bring the second upper hand H3 and the second lower hand H4 into opposed relation to the processing unit 6. Immediately after the second upper hand H3 and the second lower hand H4 are brought into opposed relation to the processing unit 6, the main control section 34 advances the second upper hand H3 toward the processing unit 6 and, as shown in FIG. 6C, locates the second upper hand H3 below a substrate W held by the spin chuck 11. Thereafter, the main control section 34 slightly moves up the second upper hand H3 to lift the processed substrate W by means of the second upper hand H3. Then, the main control section 34 retracts the second upper hand H3 from the processing unit 6 to transport the processed substrate W out of the processing unit 6. Thereafter, the main control section 34 transports the unprocessed substrate W held by the second lower hand H4 into the processing unit 6, and places the unprocessed substrate W on the spin chuck 11. The main control section 34 retracts the second lower hand H4 from the processing unit 6.

Then, the main control section 34 causes the main robot MR to transfer the substrate W between the shuttle ST and the main robot MR and, at the same time, starts horizontally moving the main robot MR along the transport passage C1. More specifically, the main control section 34 pivots and/or vertically moves the second upper hand H3 and the second lower hand H4 to bring the second upper hand H3 and the second lower hand H4 into opposed relation to the shuttle ST following the main robot MR. Simultaneously with the pivoting and/or the vertical movement of the second upper hand H3 and the second lower hand H4, the main control section 34 horizontally moves the main robot MR toward the next processing unit 6. At this time, the main control section 34 causes the shuttle ST to follow the main robot MR, thereby maintaining the main robot MR and the shuttle ST in the positional relationship that permits the substrate transfer.

Figure 6D:
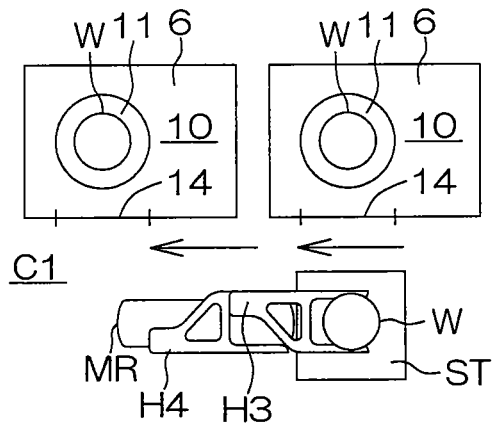

As shown in FIG. 6D, the main control section 34 transports the processed substrate W held by the second upper hand H3 into the shuttle ST following the main robot MR during the horizontal movement of the main robot MR toward the next processing unit 6. Thereafter, the main control section 34 causes the second lower hand H4 to transport another one of the unprocessed substrates W out of the shuttle ST following the main robot MR. The transfer of the unprocessed substrate W and the processed substrate W between the main robot MR and the shuttle ST may be completed before the main robot MR reaches the front of the next processing unit 6, or may be completed in the front of the next processing unit 6. In either case, the main robot MR is horizontally moved along the transport passage C1 during the transfer of the substrates W between the main robot MR and the shuttle ST, thereby suppressing an increase in transportation period due to the horizontal movement of the main robot MR. Further, where the main robot MR is moved to reach the front of the next processing unit 6 before the completion of the transfer of the substrates W between the main robot MR and the shuttle ST, the main robot MR can be horizontally moved along the transport passage C1 without increasing the substrate transportation period required for the substrate transportation by the main robot MR.

Figure 6E:
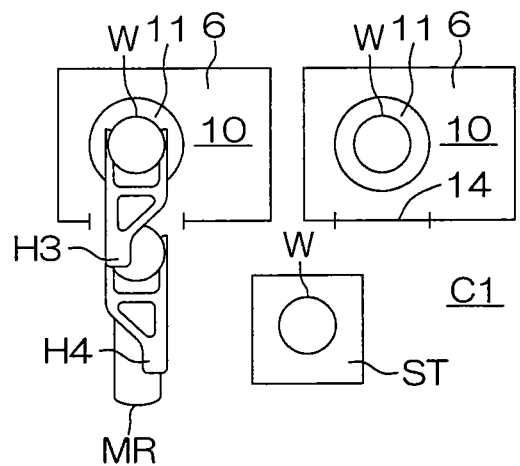

In turn, the main control section 34 causes the main robot MR to transfer the processed substrate W and the unprocessed substrate W between the next processing unit 6 and the main robot MR. More specifically, after the main robot MR reaches the front of the next processing unit 6, the main control section 34 pivots and/or vertically moves the second upper hand H3 and the second lower hand H4 to bring the second upper hand H3 and the second lower hand H4 into opposed relation to the processing unit 6. Immediately after the second upper hand H3 and the second lower hand H4 are brought into opposed relation to the processing unit 6, as shown in FIG. 6E, the main control section 34 causes the second upper hand H3 to transport the processed substrate W from the spin chuck 11. Thereafter, the main control section 34 transports the unprocessed substrate W held by the second lower hand H4 into the processing unit 6. During the transfer of the substrates W between the main robot MR and the processing unit 6, the main control section 34 causes the shuttle ST to follow the main robot MR to maintain the main robot MR and the shuttle ST in the positional relationship that permits the substrate transfer.

Figure 6F:
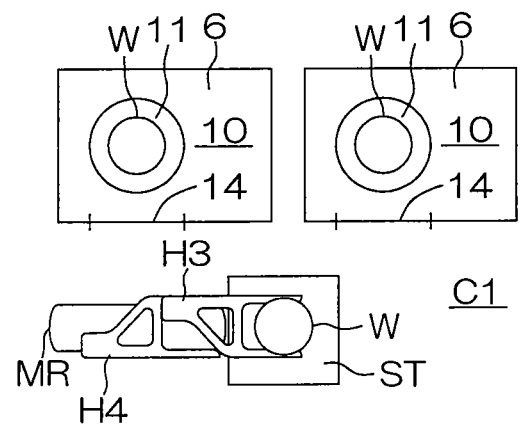

Subsequently, the main control section 34 causes the main robot MR to transfer the processed substrate W between the main robot MR and the shuttle ST. More specifically, immediately after the unprocessed substrate W is loaded into the processing unit 6 by means of the second lower hand H4, the main control section 34 pivots and/or vertically moves the second upper hand H3 and the second lower hand H4, with their horizontal position being fixed, to bring the second upper hand H3 and the second lower hand H4 into opposed relation to the shuttle ST following the main robot MR. Immediately after the second upper hand H3 and the second lower hand H4 are brought into opposed relation to the shuttle ST, the main control section 34 advances the second upper hand H3 toward the shuttle ST to transfer the processed substrate W held by the second upper hand H3 into the shuttle ST as shown in FIG. 6F. In this embodiment, the main robot MR and the shuttle ST are thus maintained in the positional relationship that permits the substrate transfer between the main robot MR and the shuttle ST, so that the main robot MR can smoothly transport the substrates W. This suppresses the increase in the substrate transportation period required for the substrate transportation by the main robot MR.

After the processed substrate W held by the second upper hand H3 is transported into the shuttle ST following the main robot MR, the main control section 34 horizontally moves the main robot MR toward the next processing unit 6 along the transport passage C1 with no substrate W held by the second upper hand H3 and the second lower hand H4. At this time, the main control section 34 horizontally moves another one of the shuttles ST retaining a plurality of unprocessed substrates W along the transport passage C1, and causes this shuttle ST to follow the main robot MR at the position adjacent to the main robot MR. That is, the main control section 34 maintains the main robot MR and the shuttle ST in the positional relationship that permits the substrate transfer between the main robot MR and the shuttle ST. Then, the main control section 34 causes the main robot MR and the respective shuttles ST to repeatedly perform the aforementioned operation.

FIGS. 7A to 7D are schematic plan views of major portions of the substrate processing apparatus 1 for explaining exemplary movements of the respective shuttles ST. With reference to FIG. 1 and FIGS. 7A to 7D, description will be given to exemplary movements of the respective shuttles ST when the substrate front surface processing operation is performed.

Figure 7A:
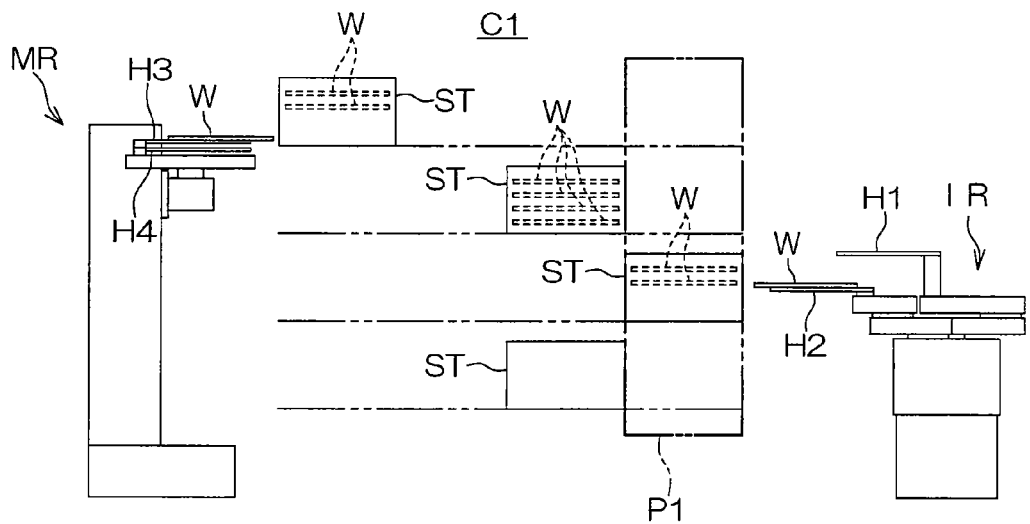
FIGS. 7A to 7D are schematic plan views of major portions of the substrate processing apparatus for explaining exemplary movements of shuttles.
Figure 7B:
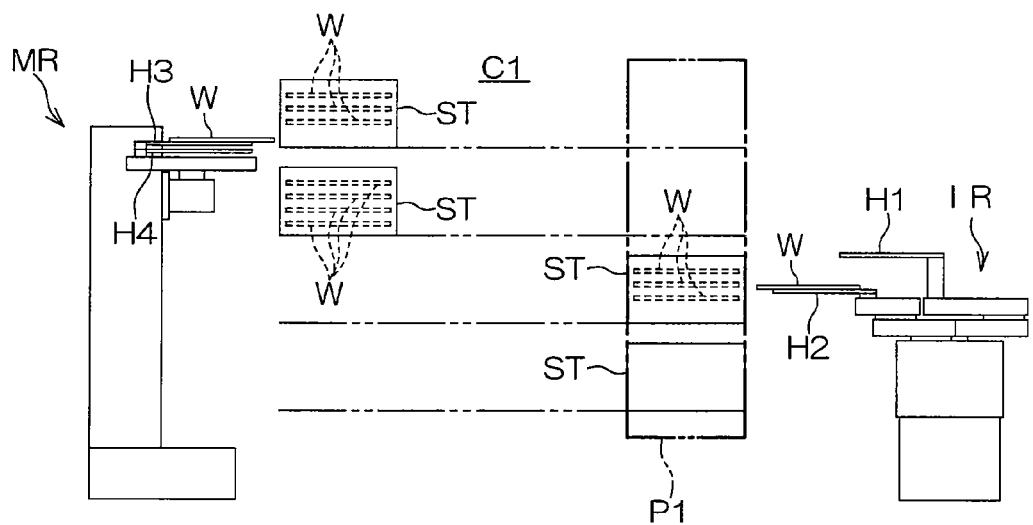
Figure 7C:
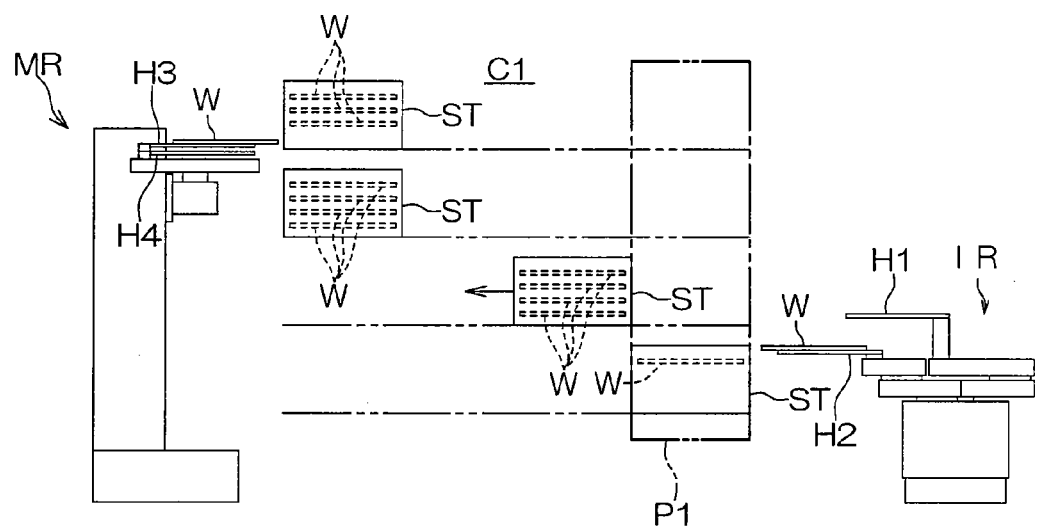

When the substrate processing apparatus 1 performs the substrate front surface processing operation, as shown in FIG. 7A, the main control section 34 causes the indexer robot IR to successively transfer a plurality of unprocessed substrates W into one of the shuttles ST (in FIG. 7A, the second lowest shuttle ST) located at the transfer position P1. As shown in FIG. 7B, the main control section 34 locates at least another one of the shuttles ST retaining no substrate W (in FIG. 7B, the lowermost shuttle ST) at the transfer position P1 before the number of the unprocessed substrates W retained in the one shuttle ST reaches the maximum retainable substrate number of the shuttle ST. When the number of the unprocessed substrates W retained in the one shuttle ST reaches the maximum retainable substrate number, the main control section 34 causes the indexer robot IR to start transferring the unprocessed substrates W into the next shuttle ST (in FIG. 7C, the lowermost shuttle ST) located at the transfer position P1 as shown in FIG. 7C. The another shuttle ST is thus located at the transfer portion P1 before the number of the unprocessed substrates W retained in the one shuttle ST reaches the maximum retainable substrate number of the shuttle ST. Therefore, the indexer robot IR can smoothly transfer the substrates W into the shuttles ST.

When the number of the unprocessed substrates W retained in the one shuttle ST located at the transfer position P1 reaches the maximum retainable substrate number of the shuttle ST, the main control section 34 horizontally moves the one shuttle ST (in FIG. 7C, the second lowest shuttle ST) to the position adjacent to the main robot MR along the transport passage C1 as shown in FIG. 7C. At this time, as shown in FIG. 7C, for example, two shuttles ST follow the main robot MR, and one shuttle ST is located at the transfer position P1, while one shuttle ST is moved between the position adjacent to the main robot MR and the transfer position P1. The main control section 34 causes the indexer robot IR and the shuttles ST to repeatedly perform this operation, whereby the shuttles ST each retaining a plurality of unprocessed substrates W are successively moved from the transfer position P1 toward the main robot MR. Therefore, the main control section 34 locates at least one of the shuttles ST at the transfer position P1, and the other shuttles ST are successively located at the transfer position P1 in place of the at least one shuttle ST. At the same time, the shuttles ST each retaining a plurality of unprocessed substrates W are successively moved from the transfer position P1 toward the main robot MR.

Figure 7D:
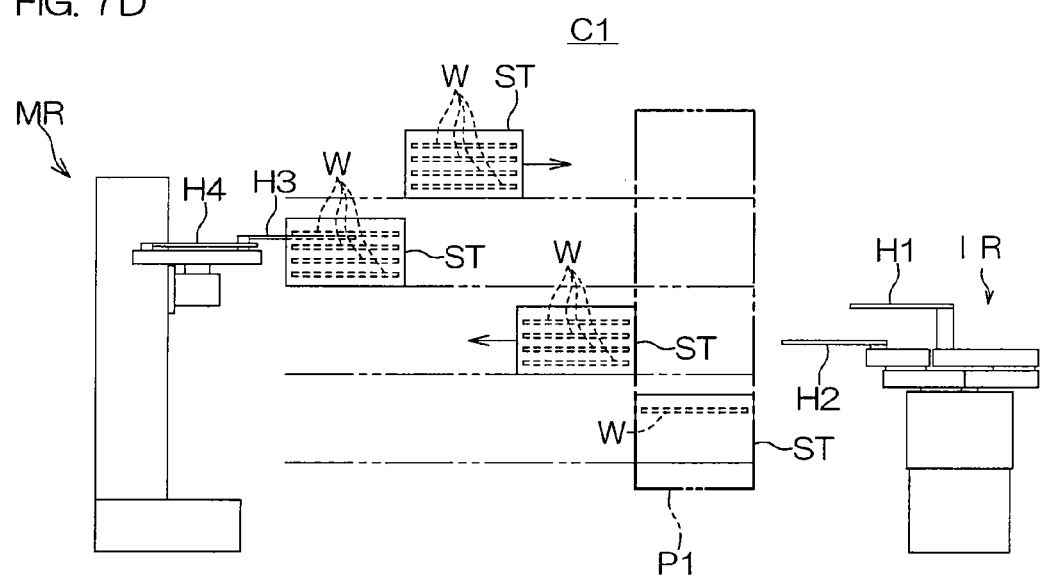

On the other hand, when one of the shuttles ST retaining a plurality of unprocessed substrates W reaches the position adjacent to the main robot MR, the main control section 34 causes this shuttle ST to follow the main robot MR at the position adjacent to the main robot MR. Then, the main control section 34 horizontally moves the main robot MR along the transport passage C1. At the same time, the main control section 34 causes the main robot MR to successively load the unprocessed substrates W into the respective processing units 6 from the one shuttle ST following the main robot MR, and to successively unload the substrates W processed in the respective processing units 6 into the one shuttle ST (in FIG. 7A, the uppermost shuttle ST). Further, as shown in FIG. 7B, the main control section 34 causes at least another one of the shuttles ST (in FIG. 7B, the second highest shuttle ST) to follow the main robot MR before the number of the processed substrates W retained in the one shuttle ST following the main robot MR reaches the maximum retainable substrate number of the shuttle ST. When the number of the processed substrates W retained in the one shuttle ST following the main robot MR reaches the maximum retainable substrate number, the main control section 34 causes the main robot MR to transport unprocessed substrates W out of the another shuttle ST (in FIG. 7D, the second highest shuttle ST) following the main robot MR as shown in FIG. 7D. The another shuttle ST is thus moved to the position adjacent to the main robot MR before the number of the processed substrates W retained in the one shuttle ST reaches the maximum retainable substrate number. Therefore, the main robot MR can smoothly transport the substrates W.

When the number of the processed substrates W retained in the one shuttle ST following the main robot MR reaches the maximum retainable substrate number, the main control section 34 horizontally moves the one shuttle ST (in FIG. 7D, the uppermost shuttle ST) toward the transfer position P1 along the transport passage C1 as shown in FIG. 7D. At this time, as shown in FIG. 7D, for example, one shuttle ST follows the main robot MR, and one shuttle ST is located at the transfer position P1, while two shuttles ST are moved between the position adjacent to the main robot MR and the transfer position P1. The main control section 34 causes the main robot MR and the shuttles ST to repeatedly perform this operation to successively move the shuttles ST each retaining a plurality of processed substrates W from the position adjacent to the main robot MR to the transfer position P1. Therefore, the main control section 34 locates at least one of the shuttles ST at the position adjacent to the main robot MR, and the other shuttles ST are successively located at the position adjacent to the main robot MR in place of the one shuttle ST. At the same time, the shuttles ST each retaining a plurality of processed substrates W are successively moved toward the transfer position P1. Then, the main control section 34 causes the indexer robot IR to successively transfer the processed substrates W into one of the carriers C from the shuttle ST located at the transfer position P1. Thus, the processed substrates are transported into the carriers C.

In this embodiment, as described above, the movements of the shuttles ST along the transport passage C1 reduce or obviate a period required for moving the main robot MR toward the transfer position P1 when the main robot MR transports the substrates W into and out of the respective processing units 6. Therefore, even if the processing units 6 are arranged alongside the transport passage C1, it is possible to suppress or prevent the increase in the substrate transportation period required for the substrate transportation by the main robot MR. This suppresses or prevents an increase in a substrate transportation period required for the substrate transportation in the substrate processing apparatus 1. Therefore, even if the processing units 6 are arranged alongside the transport passage C1, a substrate processing period required for the substrate processing operation to be performed by the substrate processing apparatus 1 is hardly influenced by the substrate transportation period required for the substrate transportation by the main robot MR. This efficiently increases the throughput of the substrate processing apparatus 1.

In this embodiment, the provision of the four shuttles ST ensures smooth transportation of the substrates W by the indexer robot IR and the main robot MR. More specifically, as described above, the main control section 34 successively moves the shuttles ST each retaining the unprocessed substrates W toward the main robot MR, while successively placing the shuttles ST in turn at the transfer position P1. Further, the main control section 34 successively moves the shuttles ST each retaining the processed substrates W toward the transfer position P1, while successively placing the shuttles ST in turn at the position adjacent to the main robot MR. In a certain case, the successive placement of the shuttles ST at the transfer position P1 and the successive placement of the shuttles ST at the position adjacent to the main robot MR occur simultaneously. Even in this case, as shown in FIG. 7D, these successive placements can be smoothly achieved because of the provision of the four shuttles ST in this embodiment, thereby making it possible to move two shuttles ST between the transfer position P1 and the position adjacent to the main robot MR while placing the other two shuttles ST at the transfer position P1 and the position adjacent to the main robot MR, respectively. Thus, the indexer robot IR and the main robot MR can smoothly transport the substrates W.

In this embodiment, the processing chambers 10 of the processing units 6 are uniform in shape and size, so that the spin chucks 11 are disposed in the same positional relation to the corresponding processing chambers 10 so as to be each located at the predetermined position spaced from the center of the corresponding processing chamber 10 parallel to the transport passage C1. That is, the specifications of the respective processing units 6 are at least partly commonized. This makes it possible to easily design and produce the processing units 6 and share their parts, thereby correspondingly reducing the production costs.

In this embodiment, as described above, the spin chucks 11 of each two processing units 6 disposed on opposite sides of the transport passage C1 are offset parallel to the transport passage C1. Therefore, the MR movement mechanism 7 needs to move the main robot MR along the transport passage C1 when the main robot MR transfers the substrates W with respect to the two spin chucks 11. According to this embodiment, however, the shuttles ST are moved along the transport passage C1, whereby the transport load of the main robot MR is alleviated. This suppresses or prevents the increase in the substrate transportation period required for the substrate transportation by the main robot MR, and makes it possible to easily design and produce the processing units 6.

In this embodiment, the main robot MR and the shuttles ST are movable along the transport passage C1, so that a relatively large space can be defined in the transport passage C1. Therefore, when a maintenance operation is performed on the processing units 6, for example, an operation space can be provided in the transport passage C1 by moving the main robot MR and the shuttles ST to a position apart from the processing units 6. Thus, the maintenance operation and other operations can be efficiently performed in the substrate processing apparatus 1.

Figure 8:
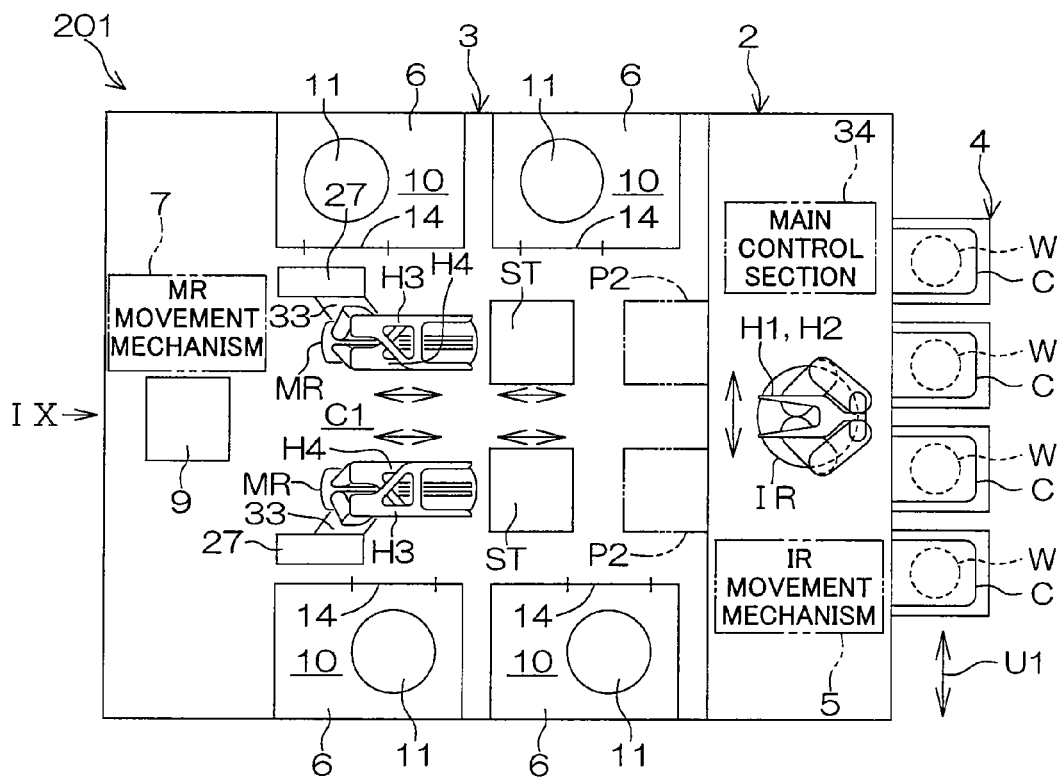
FIG. 8 is a schematic plan view showing a layout in a substrate processing apparatus according to a second embodiment of the present invention.
Figure 9:
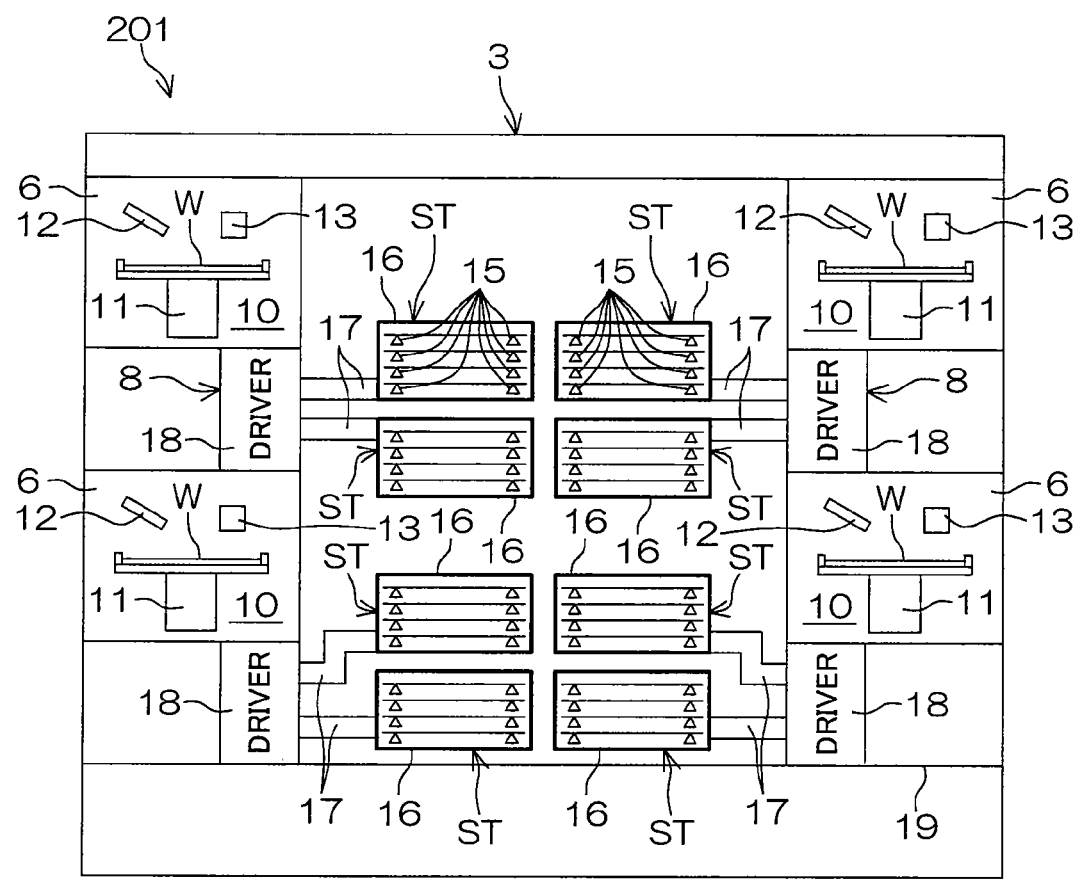
FIG. 9 is a schematic side view of the substrate processing apparatus as seen in an arrow direction IX in FIG. 8.

FIG. 8 is a schematic plan view showing a layout in a substrate processing apparatus 201 according to a second embodiment of the present invention. FIG. 9 is a schematic side view of the substrate processing apparatus 201 as seen in an arrow direction IX in FIG. 8. In FIG. 9, some components (a main robot MR and an inversion unit 9 to be described later) of the substrate processing apparatus 201 are not shown. In FIGS. 8 and 9, components equivalent to those shown in FIGS. 1 to 7D will be denoted by the same reference characters as in FIGS. 1 to 7D, and duplicate description will be omitted.

A major difference between the second embodiment and the first embodiment described above is that two units each including a main robot MR and a plurality of shuttles ST associated with the main robot MR are provided and two transfer positions P2 are defined on the transport passage C1. The main robot MR of one of the units and the shuttles ST associated with this main robot MR are disposed adjacent one of two rows of plural processing units 6 (illustrated on an upper side in FIG. 8) in the transport passage C1. The main robot MR of the other unit and the shuttles ST associated with this main robot MR are disposed adjacent the other row of plural processing units 6 (illustrated on a lower side in FIG. 8) in the transport passage C1.

The two transfer positions P2 are located closest to the indexer block 2 on the transport passage C1. More specifically, one of the transfer positions P2 (an upper transport position in FIG. 8) is located adjacent the one row of plural processing units 6 in the transport passage C1. The other transfer position P2 is located adjacent the other row of plural processing units 6 in the transport passage C1. The shuttle movement mechanism 8 individually horizontally moves the shuttles ST associated with the one main robot MR between a position adjacent to the one main robot MR and the one transfer position P2 along the transport passage C1. Further, the shuttle movement mechanism 8 individually horizontally moves the shuttles ST associated with the other main robot MR between a position adjacent to the other main robot MR and the other transfer position P2 along the transport passage C1.

The main control section 34 causes the indexer robot IR to transfer substrates W between any of the carriers C and one of the shuttles ST located at the one transfer position P2. As described in the first embodiment, the main control section 34 causes the one main robot MR to transport the substrates W between any of the processing units 6 in the one row and any of the shuttles ST associated with the one main robot MR. At this time, as described in the first embodiment, the main control section 34 individually horizontally moves the shuttles ST associated with the one main robot MR between the position adjacent to the one main robot MR and the one transfer position P2 along the transport passage C1.

Similarly, the main control section 34 causes the indexer robot IR to transfer substrates W between any of the carriers C and one of the shuttles ST located at the other transfer position P2. As described in the first embodiment, the main control section 34 causes the other main robot MR to transport the substrates W between any of the processing units 6 in the other row and any of the shuttles ST associated with the other main robot MR. At this time, as described in the first embodiment, the main control section 34 individually horizontally moves the shuttles ST associated with the other main robot MR between the position adjacent to the other main robot MR and the other transfer position P2 along the transport passage C1.

In this embodiment, as described above, the two units each including the main robot MR and the plurality of shuttles ST associated with the main robot MR are provided. Therefore, the substrate transportation period is shorter in the substrate processing apparatus 201 than in the substrate processing apparatus 1. Even if the plurality of processing units 6 are arranged alongside the transport passage C1, a substrate processing period required for a substrate processing operation to be performed by the substrate processing apparatus 201 is hardly influenced by substrate transportation periods required for the substrate transportation by the main robots MR. This efficiently increases the throughput of the substrate processing apparatus 201.

Figure 10:
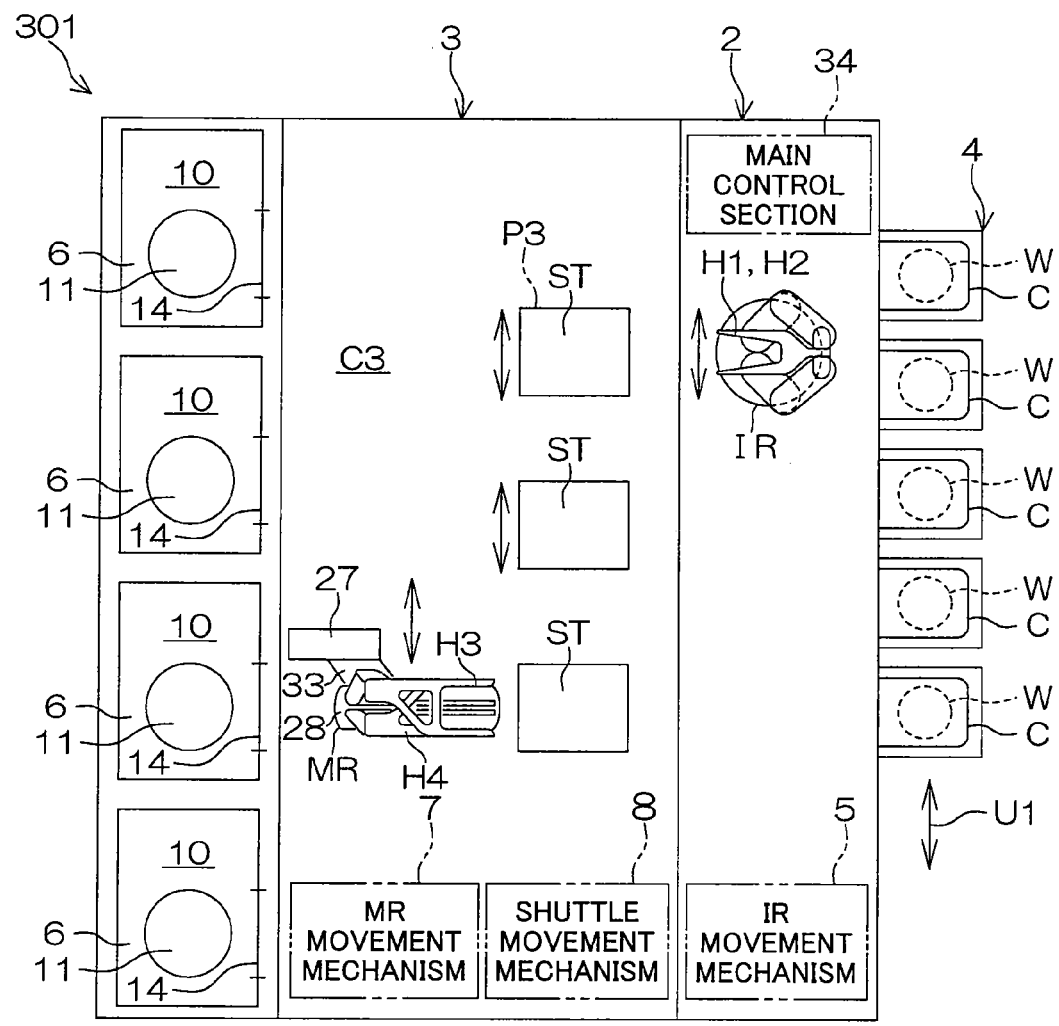
FIG. 10 is a schematic plan view showing a layout in a substrate processing apparatus according to a third embodiment of the present invention.

FIG. 10 is a schematic plan view showing a layout in a substrate processing apparatus 301 according to a third embodiment of the present invention. In FIG. 10, components equivalent to those shown in FIGS. 1 to 9 will be denoted by the same reference characters as in FIGS. 1 to 9, and duplicate description will be omitted.

A major difference between the third embodiment and the first embodiment described above is that a transport passage C3 is provided parallel to the carrier alignment direction U1, and the processing units 6 are arranged parallel to the carrier alignment direction U1 alongside the transport passage C3. The eight processing units 6 are aligned in a row on one side of the transport passage C3 opposite from the indexer block 2. Each two of the eight processing units 6 are vertically stacked with their doors 14 facing toward the indexer block 2. The main robot MR is disposed adjacent the processing units 6 in the transport passage C3. The shuttles ST are disposed adjacent the indexer block 2 in the transport passage C3.

The MR movement mechanism 7 horizontally moves the main robot MR along a portion of the transport passage C3 adjacent to the processing units 6. The shuttle movement mechanism 8 individually horizontally moves the shuttles ST between a position adjacent to the main robot MR and a position adjacent to the indexer robot IR along the transport passage C3. That is, the position adjacent to the indexer robot IR in the transport passage C3 is defined as a transfer position P3 in this embodiment. Therefore, the transfer position P3 is defined at different positions in the transport passage C3 according to the movement of the indexer robot IR along the carrier alignment direction U1.

The main control section 34 causes the indexer robot IR to transfer the substrates W between any of the carriers C and one of the shuttles ST located at the position adjacent to the indexer robot IR. As described in the first embodiment, the main control section 34 causes the main robot MR to transport the substrates between any of the processing units 6 and any of the shuttles ST. At this time, as described in the first embodiment, the main control section 34 individually horizontally moves the shuttles ST between the position adjacent to the main robot MR and the position adjacent to the indexer robot IR along the transport passage C3.

In this embodiment, as described above, the transfer position P3 is defined at the position adjacent to the indexer robot IR in the transport passage C3. Therefore, there is no need to move the indexer robot IR when the indexer robot IR transfers the substrates W between any of the carriers C and the shuttle ST located at the transfer position P3. This reduces a substrate transfer period required for the substrate transfer by the indexer robot IR, thereby efficiently increasing the throughput of the substrate processing apparatus 301.

Figure 11:
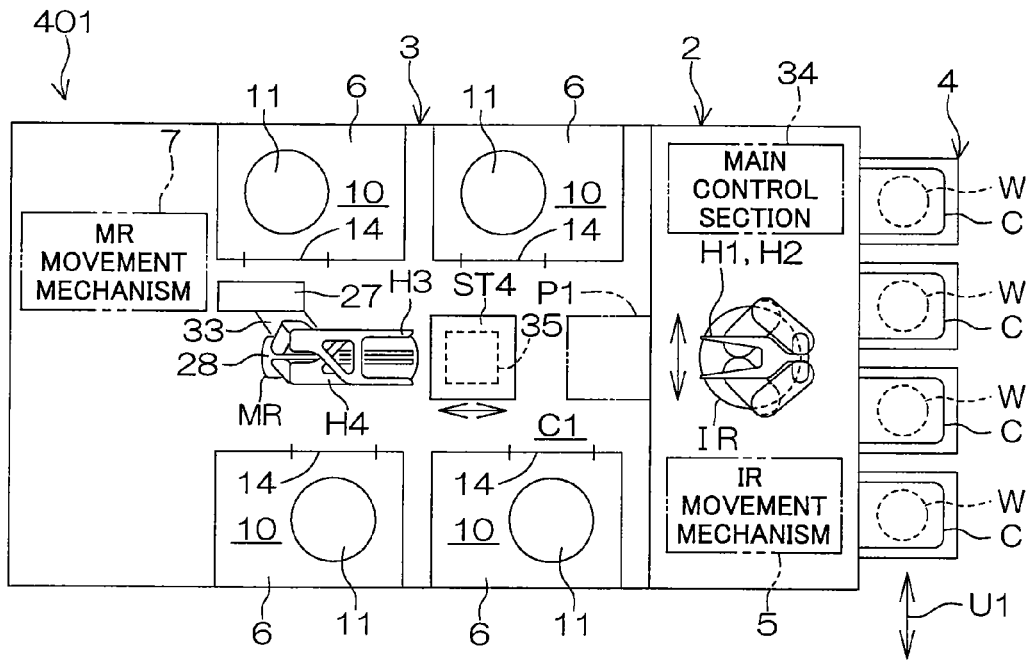
FIG. 11 is a schematic plan view showing a layout in a substrate processing apparatus according to a fourth embodiment of the present invention.
Figure 12:
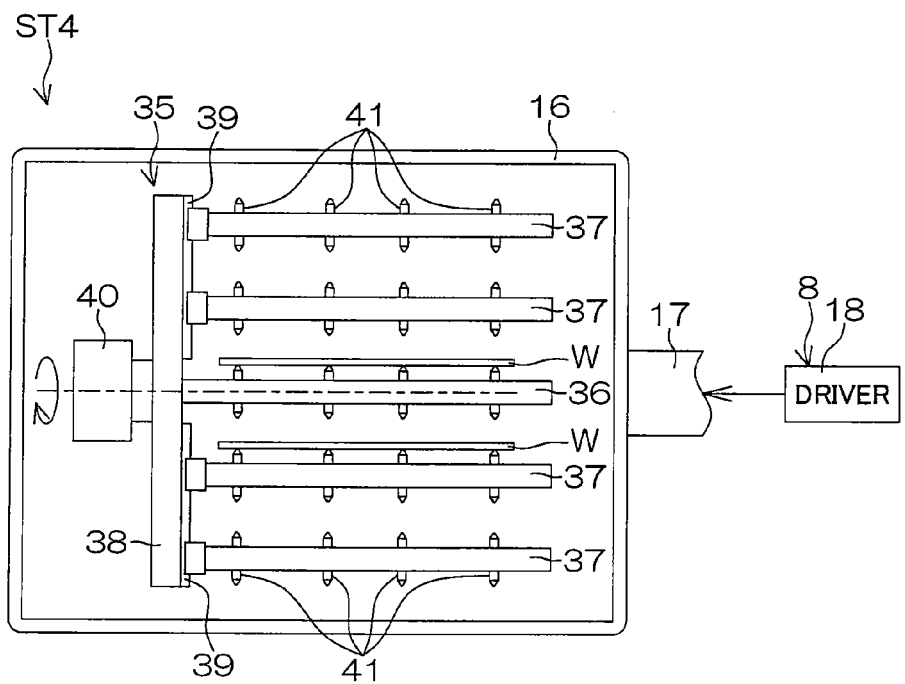
FIG. 12 is a schematic side view of a shuttle provided in the substrate processing apparatus according to the fourth embodiment of the present invention.

FIG. 11 is a schematic plan view showing a layout in a substrate processing apparatus 401 according to a fourth embodiment of the present invention. FIG. 12 is a schematic side view of a shuttle ST4 provided in the substrate processing apparatus 401 according to the fourth embodiment of the present invention. In FIGS. 11 and 12, components equivalent to those shown in FIGS. 1 to 10 will be denoted by the same reference characters as in FIGS. 1 to 10, and duplicate description will be omitted.

A major difference between the fourth embodiment and the first embodiment described above is that shuttles ST4 (standby mechanisms) each include a standby substrate inverting mechanism 35 which inverts the substrates W retained in standby in the shuttle ST4. As shown in FIG. 12, the standby substrate inverting mechanism 35 is disposed in a casing 16 of the shuttle ST4 and supported by the casing 16. Therefore, when a driving force of the shuttle movement mechanism 8 is applied to the casings 16 of the respective shuttles ST4, the casings 16 and the standby substrate inverting mechanism 35 are unitarily horizontally moved along the transport passage C1.

As shown in FIG. 12, the standby substrate inverting mechanism 35 includes a stationary plate 36, and a plurality of movable plates 37 disposed parallel to the stationary plate 36 on vertically opposite sides of the stationary plate 36. The stationary plate 36 and the movable plates 37 each have a rectangular shape, and overlap each other as seen in plan or in a direction normal to the stationary plate 36. The stationary plate 36 is fixed to a vertically extending support plate 38. More specifically, the stationary plate 36 is fixed to the support plate 38 as extending normal to the support plate 38. The movable plates 37 are attached to the support plate 38 via a linear guide 39 fixed to a surface of the stationary plate 36, and extend parallel to the stationary plate 36. The movable plates 37 are movable relative to the support plate 38. The movable plates 37 are each moved normal to the stationary plate 36 by an actuator (not shown) such as an air cylinder.

Further, a rotary actuator 40 is attached to the support plate 38. The rotary actuator 40 unitarily rotates the stationary plate 36 and the movable plates 37 together with the support plate 38 about a horizontal rotation axis. The rotary actuator 40 rotates the support plate 38 180 degrees about the horizontal rotation axis to invert the stationary plate 36 and the movable plates 37.

The stationary plate 36 and the movable plates 37 each include a plurality of support pins 41 provided on opposite surfaces thereof. As a result, the support pins 41 are provided on opposed surfaces of two adjacent ones of the stationary plate 36 and the movable plates 37 (e.g., an upper surface of the stationary plate 36 and a lower surface of the movable plate 37 disposed just above the stationary plate 36). On each of the surfaces of these plates, the support pins 41 are disposed in properly spaced relation on a circle conformal to an outer peripheral shape of the substrate W. The stationary plate 36 is capable of horizontally supporting a single substrate W on the support pins 41 thereof when being in a horizontal attitude. Similarly, the movable plates 37 are each capable of horizontally supporting a single substrate W on the support pins 41 thereof when being in a horizontal attitude.

A substrate W can be horizontally held between the stationary plate 36 and the movable plate 37 disposed just above the stationary plate 36, for example, by moving down the movable plate 37 with the substrate W being rested on the horizontal stationary plate 36. Further, a substrate W can be horizontally held between the lowermost movable plate 37 and the second lowest movable plate 37 (see FIG. 12), for example, by moving up the lowermost movable plate 37 with the substrate W being rested on the lowermost movable plate 37. With the substrates W being held between the stationary plate 36 and the movable plates 37 and/or between the movable plates 37, the support plate 38 is rotated about the horizontal rotation axis by the rotary actuator 40, whereby the substrates W thus held are inverted.

Where the substrate processing apparatus 401 according to the fourth embodiment performs a substrate rear surface processing operation, for example, the indexer robot IR transfers unprocessed substrates W one by one from any of the carriers C into one of the shuttles ST4 located at the transfer position P1, whereby the unprocessed substrates W are retained in the shuttle ST4. Then, the shuttle movement mechanism 8 moves the shuttle ST4 retaining the unprocessed substrates W to the position adjacent to the main robot MR, and causes the shuttle ST4 to follow the main robot MR. The standby substrate inverting mechanism 35 collectively inverts the substrates W retained in standby in the shuttle ST4 during the movement of the shuttle ST4 in the transport passage C1, so that the rear surfaces of the respective substrates W face up. Then, the main robot MR loads the unprocessed substrates W into the respective processing units 6 from the shuttle ST4, whereby the rear surfaces of the substrates W are processed.

After the processing of the rear surfaces of the substrates W, the main robot MR unloads the processed substrates W from the respective processing units 6 into the shuttle ST4 with the rear surfaces of the substrates W facing up. Thereafter, the shuttle movement mechanism 8 moves the shuttle ST4 following the main robot MR toward the transfer position P1. The standby substrate inverting mechanism 35 collectively inverts the substrates W retained in standby in the shuttle ST4 during the movement of the shuttle ST4 in the transport passage C1, so that the front surfaces of the substrates W face up. Then, the indexer robot IR transfers the processed substrates W from the shuttle ST4 located at the transfer position P1 into any of the carriers C. Thus, the processing of the rear surfaces of the substrates W is completed in the substrate processing apparatus 401.

In this embodiment, as described above, the standby substrate inverting mechanism 35 which inverts the substrates W is provided in each of the shuttles ST4. This obviates the need for moving the main robot MR to the position adjacent to the inversion unit 9 (see FIG. 1) by the MR movement mechanism 7, as in the substrate processing apparatus 1 according to the first embodiment, when the substrates W are inverted. Therefore, the inversion of the substrates W can be achieved without increasing the substrate transportation period required for the substrate transportation by the main robot MR. Even if the rear surfaces of the substrates or the opposite surfaces of the substrates W are processed, the substrate transportation period required for the substrate transportation in the substrate processing apparatus 401 is hardly increased.

Figure 13:
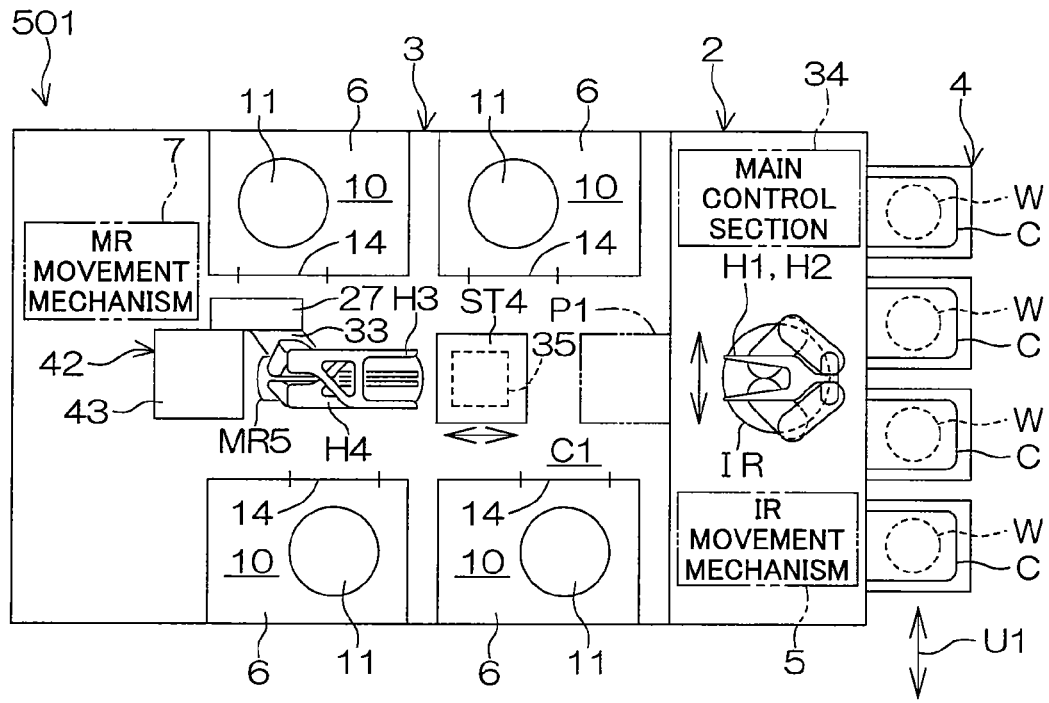
FIG. 13 is a schematic plan view showing a layout in a substrate processing apparatus according to a fifth embodiment of the present invention.
Figure 14:
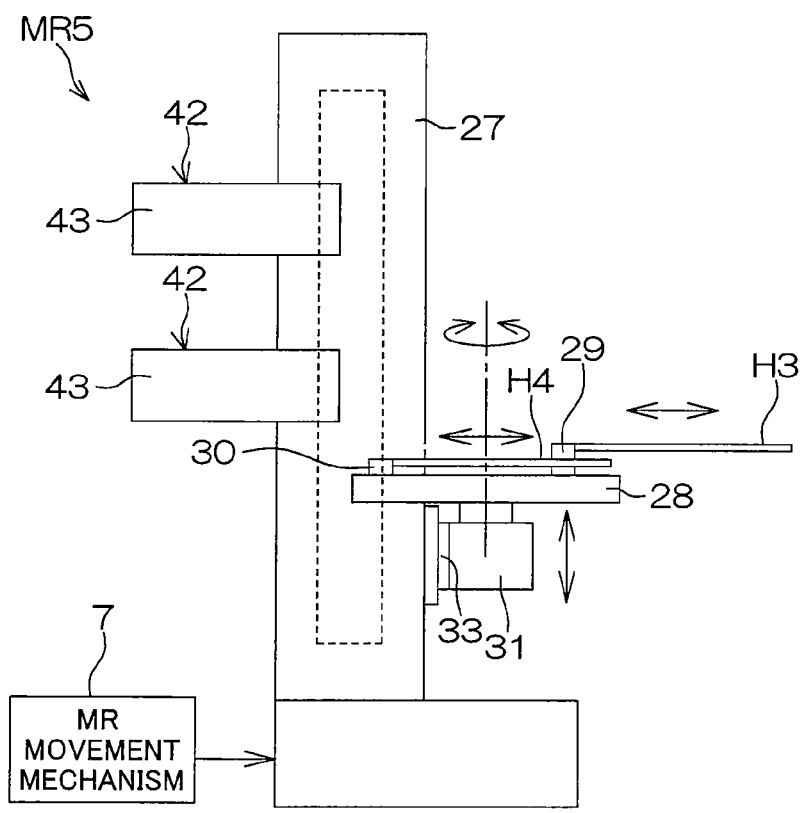
FIG. 14 is a schematic side view of a main robot provided in the substrate processing apparatus according to the fifth embodiment of the present invention.

FIG. 13 is a schematic plan view showing a layout in a substrate processing apparatus 501 according to a fifth embodiment of the present invention. FIG. 14 is a schematic side view of a main robot MR5 provided in the substrate processing apparatus 501 according to the fifth embodiment of the present invention. In FIGS. 13 and 14, components equivalent to those shown in FIGS. 1 to 12 will be denoted by the same reference characters as in FIGS. 1 to 12, and duplicate description will be omitted.

A major difference between the fifth embodiment and the first embodiment described above is that the shuttles ST4 each include a standby substrate inverting mechanism 35 as described above, and the main robot MR5 (transport mechanism) includes inversion mechanisms 42 which each invert substrates W retained thereby. In this embodiment, two inversion mechanisms 42 are provided, and connected to the robot body 27. The inversion mechanisms 42 each have the same construction as the aforementioned standby substrate inverting mechanisms 35, and are capable of horizontally retaining the substrates W in a casing 43 thereof and inverting the substrates W thus retained. The main robot MR5 is capable of transporting the substrates W into and out of the respective inversion mechanisms 42 by means of the second upper hand H3 and the second lower hand H4.

Where the substrate processing apparatus 501 according to the fifth embodiment performs a substrate front and rear surface processing operation, for example, the indexer robot IR transfers unprocessed substrates W one by one from any of the carriers C into one of the shuttles ST4 located at the transfer position P1, whereby the unprocessed substrates W are retained in the shuttle ST4. Then, the shuttle movement mechanism 8 (see FIG. 2) moves the shuttle ST4 retaining the unprocessed substrates W to a position adjacent to the main robot MR5, and causes the shuttle ST4 to follow the main robot MR5. The standby substrate inverting mechanism 35 collectively inverts the substrates W retained in standby in the shuttle ST4 during the movement of the shuttle ST4 in the transport passage C1, so that the rear surfaces of the substrates W face up. Then, the main robot MR5 transports the unprocessed substrates W into the respective processing units 6 from the shuttle ST4, whereby the rear surfaces of the substrates W are processed.

After the processing of the rear surfaces of the substrates W, the main robot MR5 unloads the rear-surface-processed substrates W from the respective processing units 6 by means of the second upper hand H3. Then, the main robot MR5 transports the substrates W into one of the inversion mechanisms 42 by means of the second upper hand H3, whereby the substrates W are inverted with their front surfaces facing up. After the inversion of the substrates W, the main robot MR5 transports the substrates W out of the inversion mechanism 42 with the front surfaces of the substrates W facing up by means of the second upper hand H3. Thus, the inversion of the substrates W by the main robot MR5 is completed. During the inversion of the substrates W by the main robot MR5, the main control section 34 (see FIG. 5) may locate at least one of the shuttles ST4 at a position adjacent to the main robot MR5 and cause the shuttle ST4 to follow the main robot MR5, or may move the respective shuttles ST4 between the position adjacent to the main robot MR5 and the transfer position P1 or maintain any one of the shuttles ST4 in standby at the transfer position P1 without causing any of the shuttles ST4 to follow the main robot MR5.

Thus, the substrates W are each transported out of the inversion mechanism 42 by means of the second upper hand H3, and loaded into any of the processing units 6 by the main robot MR5 with the front surface thereof facing up. Thus, the substrates W are loaded into the respective processing units 6 with their front surfaces facing up, whereby the front surfaces of the substrates W are processed. After the processing of the front surfaces of the substrates W, the main robot MR5 successively transports the processed substrates W from the respective processing units 6 into the shuttle ST4. Thereafter, the shuttle movement mechanism 8 moves the shuttle ST4 following the main robot MR5 toward the transfer position P1. At this time, the standby substrate inverting mechanism 35 of the shuttle ST4 does not invert the substrates W retained in standby in the shuttle ST4, but maintains the substrates W with their front surfaces facing up. Then, the indexer robot IR transfers the processed substrates W from the shuttle ST4 located at the transfer position P1 into any of the carriers C. Thus, the processing of the front and rear surfaces of the substrates W is completed in the substrate processing apparatus 501.

In this embodiment, as described above, the mechanisms for inverting the substrates W are provided not only in the shuttles ST4 but also in the main robot MR5, so that the shuttles ST4 can efficiently work. More specifically, for example, the shuttles ST4 may each be moved between the position adjacent to the main robot MR5 and the transfer position P1, or maintained in standby at the transfer position P1 without causing the shuttles ST4 to follow the main robot MR5 during the inversion of the substrates W by the main robot MR5. Thus, the shuttles ST4 can efficiently work to ensure smooth substrate transportation in the substrate processing apparatus 501.

Figure 15:
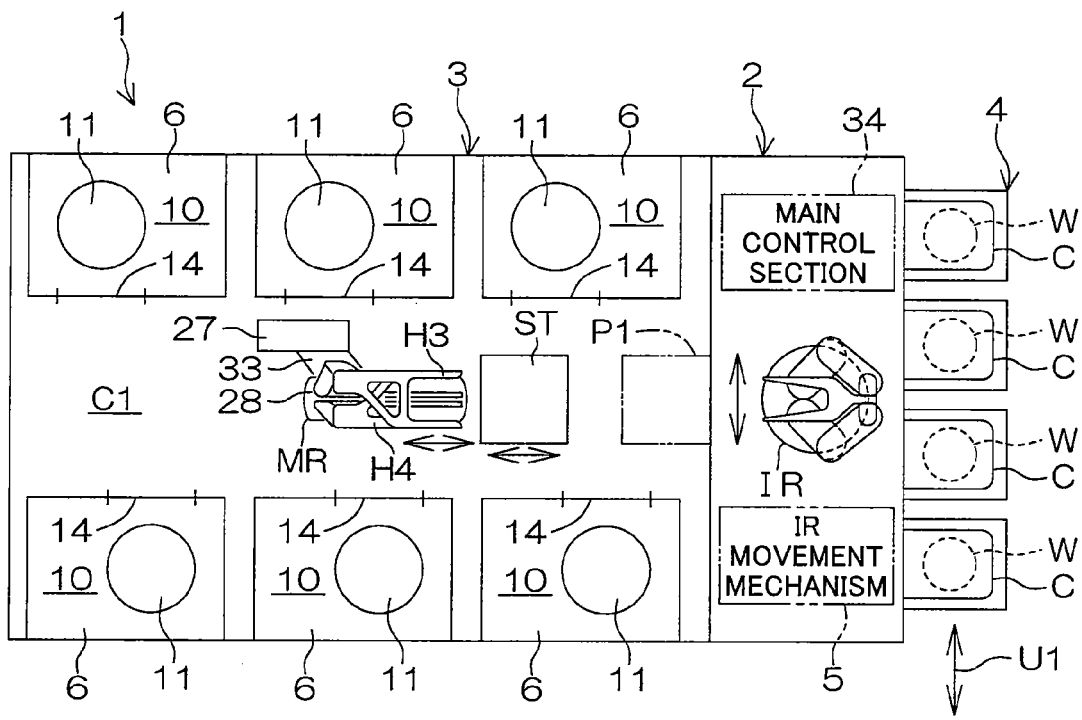
FIG. 15 is a schematic plan view showing another exemplary layout in the substrate processing apparatus according to the first embodiment of the present invention.
Figure 16:
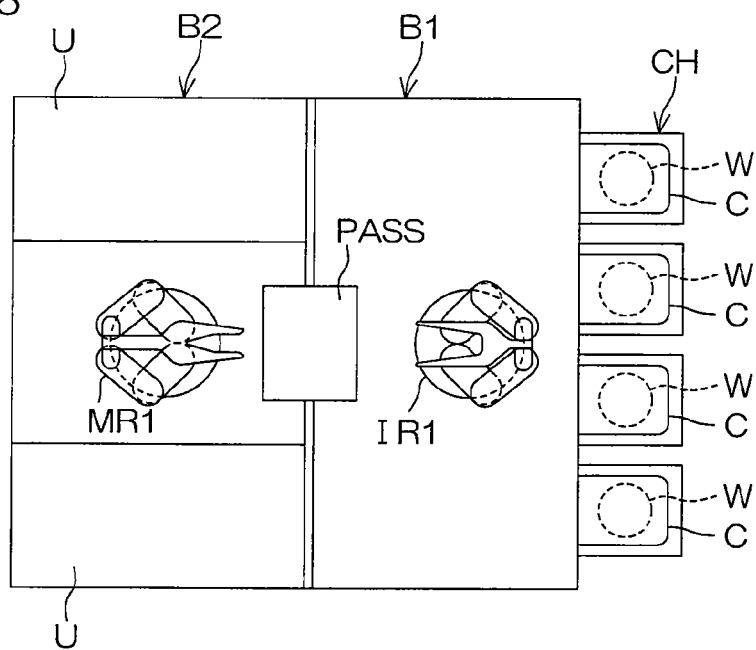
FIG. 16 is a schematic plan view showing a layout in a prior art substrate processing apparatus.
Figure 17:
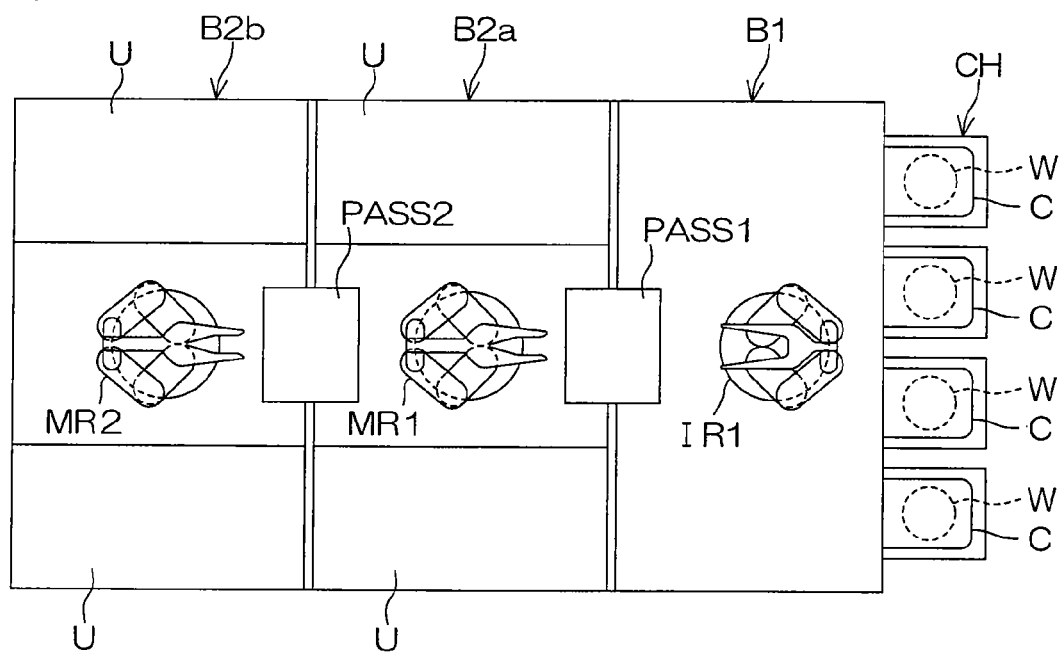
FIG. 17 is a schematic plan view showing a layout in another prior art substrate processing apparatus.

While the embodiments of the present invention have thus been described, the invention may be embodied in other ways. In the first to fifth embodiments, the eight processing units 6 are provided by way of example, but the number of the processing units 6 may be not greater than seven or may be not less than nine. More specifically, as shown in FIG. 15, the substrate processing apparatus 1 according to the first embodiment may include four additional processing units 6, which are arranged alongside the transport passage C1. Even if the additional processing units 6 are provided alongside the transport passage C1 in any of the substrate processing apparatuses 1, 201, 301, 401, 501 according to the first to fifth embodiments, the transportation of the substrates W into the respective processing units 6 can be achieved simply by extending the movable range of the main robot MR along the transport passage C1. This suppresses an increase in production costs due to an increase in the number of the processing units 6.

In the first to fifth embodiments described above, the four shuttles ST, ST4 are provided for each main robot MR by way of example, but the number of the shuttles for each main robot MR may be one or may be two or more. Even if only one shuttle is provided for each main robot MR, the substrate transfer by the indexer robot IR and the substrate transportation by the main robot MR can be achieved without or substantially without temporary interruption. Therefore, even if the number of the shuttles for each main robot MR is not greater than three, the increase in the substrate transportation period required for the substrate transportation in any of the substrate processing apparatuses 1, 201, 301, 401, 501 can be suppressed or prevented. If five or more shuttles are provided for each main robot MR, the increase in the substrate transportation period required for the substrate transportation in any of the substrate processing apparatuses 1, 201, 301, 401, 501 can be suppressed or prevented as described in the first to fifth embodiments.

In the first to fifth embodiments, the indexer robot IR transfers the substrates W one by one into the shuttle ST, ST4, but instead a robot configured to transfer a plurality of substrates W into the shuttle ST, ST4 at a time may be employed.

While preferred embodiments of the present invention have been described above, it is to be understood that variations and modifications will be apparent to those skilled in the art without departing the scope and spirit of the present invention. The scope of the present invention, therefore, is to be determined by the following claims.

The present application corresponds to Japanese Patent Application No. 2009-082844 filed in the Japan Patent Office on Mar. 30, 2009, and the entire disclosure of the application is incorporated herein by reference.

What is claimed is:

1. A substrate transport method comprising:
a standby mechanism moving step of moving a plurality of standby mechanisms individually along a predetermined transport passage provided alongside a plurality of substrate processing sections, each of the standby mechanisms being adapted to retain a substrate in standby;
wherein the plurality of standby mechanisms are offset from each other in a direction crossing a standby mechanism movement direction of the transport passage,
a transport mechanism moving step of moving a transport mechanism along the transport passage, the transport mechanism being adapted to transport the substrate; and
a transporting step of causing the transport mechanism to transport the substrate between any of the substrate processing sections and the corresponding standby mechanism.

2. The substrate transport method according to claim 1 further comprising a position maintaining step of maintaining the transport mechanism and the standby mechanism in a positional relationship that permits substrate transfer between the transport mechanism and the standby mechanism.

3. The substrate transport method according to claim 1, wherein
the transporting step includes a mid-movement transferring step of transferring the substrate between the transport mechanism and the standby mechanism while moving the transport mechanism and the standby mechanism along the transport passage.

4. The substrate transport method according to claim 1, wherein
a container retaining portion which retains a container for containing the substrate is provided adjacent the transport passage, and
the standby mechanism includes a plurality of standby mechanisms which are individually movable along the transport passage,
the substrate transport method further comprising the steps of:

causing a substrate transfer mechanism to transfer the substrate between any of the standby mechanisms and the container retained by the container retaining portion at a predetermined transfer position on the transport passage;

causing a first standby mechanism, which is at least one of the standby mechanisms, to follow the transport mechanism at a position adjacent to the transport mechanism; and moving a second standby mechanism, which is at least one of the standby mechanisms different from the first standby mechanism, between the position adjacent to the transport mechanism and the transfer position.

5. The substrate transport method according to claim 4, wherein the standby mechanism includes at least three standby mechanisms, the substrate transport method further comprising the steps of:

locating the second standby mechanism at the transfer position; and moving a third standby mechanism, which is at least one of the standby mechanisms different from the first and second standby mechanisms, between the position adjacent to the transport mechanism and the transfer position.

6. The substrate transport method according to claim 4, wherein the standby mechanism includes at least four standby mechanisms, the substrate transport method further comprising the steps of:

locating the second standby mechanism at the transfer position; and moving at least two third standby mechanisms, which are at least two of the standby mechanisms different from the first and second standby mechanisms, between the position adjacent to the transport mechanism and the transfer position.

7. The substrate transport method according to claim 1, further comprising the step of inverting the substrate retained in standby by the standby mechanism.

8. The substrate transport method according to claim 1, further comprising the step of inverting the substrate held by the transport mechanism.

* * * * *